United States Patent
Bonora et al.

(10) Patent No.: US 6,435,330 B1
(45) Date of Patent: Aug. 20, 2002

(54) IN/OUT LOAD PORT TRANSFER MECHANISM

(75) Inventors: Anthony C. Bonora, Menlo Park; Richard H. Gould, Fremont, both of CA (US)

(73) Assignee: Asyai Technologies, Inc., Fremont, CA (US)

( * ) Notice: Subject to any disclaimer, the term of this patent is extended or adjusted under 35 U.S.C. 154(b) by 0 days.

(21) Appl. No.: 09/467,103

(22) Filed: Dec. 10, 1999

Related U.S. Application Data
(60) Provisional application No. 60/112,947, filed on Dec. 18, 1998.

(51) Int. Cl.⁷ .............................................. B65G 37/00
(52) U.S. Cl. ................................ 198/346.3; 198/346.1; 198/725; 198/465.2
(58) Field of Search ........................... 198/346.3, 346.1, 198/725, 465.2

(56) References Cited

U.S. PATENT DOCUMENTS

| | | | |
|---|---|---|---|
| 3,746,148 A | 7/1973 | Hilger et al. ................ | 198/219 |
| 3,840,110 A | 10/1974 | Molt et al. .............. | 198/127 R |
| 3,927,620 A | 12/1975 | Clapham ............. | 104/148 LM |
| 3,976,330 A | 8/1976 | Babinski et al. ............ | 302/2 R |
| 4,014,428 A | 3/1977 | Ossbahr ....................... | 198/345 |
| 4,093,084 A | 6/1978 | Ringer ..................... | 214/11 R |
| 4,305,335 A | 12/1981 | Plugge ..................... | 104/172 B |
| 4,453,627 A | 6/1984 | Wilkins ...................... | 198/781 |
| 4,461,382 A | 7/1984 | Hoover et al. .............. | 198/781 |
| 4,513,854 A | 4/1985 | Prodel et al. ................ | 198/472 |
| 4,515,264 A | 5/1985 | Sticht ......................... | 198/344 |
| 4,530,287 A | 7/1985 | Sticht ......................... | 104/168 |
| 4,534,462 A | 8/1985 | Hoover et al. .............. | 198/781 |
| 4,572,358 A | 2/1986 | Swain ......................... | 198/781 |
| 4,619,205 A | 10/1986 | Sticht ......................... | 104/168 |
| 4,793,262 A | 12/1988 | Horn ........................... | 104/168 |
| 4,805,759 A | 2/1989 | Rochet et al. ........... | 198/346.1 |
| 4,826,360 A | 5/1989 | Iwasawa et al. .............. | 406/51 |
| 4,845,843 A | 7/1989 | Babcock ....................... | 29/829 |
| 4,926,753 A | 5/1990 | Weiss .......................... | 104/88 |
| 4,940,000 A | 7/1990 | Horvath et al. ............. | 104/295 |
| 4,974,519 A | 12/1990 | Miletto ........................ | 104/165 |
| 5,086,910 A | 2/1992 | Terpstra ...................... | 198/572 |
| 5,129,507 A | 7/1992 | Maeda et al. ................ | 198/781 |
| 5,213,201 A | 5/1993 | Huber et al. ................ | 198/781 |
| 5,285,887 A | 2/1994 | Hall ............................ | 198/460 |
| 5,318,167 A | 6/1994 | Bronson et al. ............ | 198/577 |
| 5,411,358 A | 5/1995 | Garric et al. ............... | 414/277 |
| 5,452,801 A | 9/1995 | Horn ........................... | 206/454 |
| 5,521,563 A | 5/1996 | Mazzochette ............... | 333/116 |
| 5,529,166 A | 6/1996 | Markin et al. .............. | 198/349 |
| 5,533,844 A | 7/1996 | Ekleberry ................... | 409/159 |
| 5,673,804 A | 10/1997 | Weiss et al. ................ | 212/274 |

FOREIGN PATENT DOCUMENTS

EP    0 674 069 A1    3/1994

*Primary Examiner*—Christopher P. Ellis
*Assistant Examiner*—Rashmi Sharma
(74) *Attorney, Agent, or Firm*—O'Melveny & Myers LLP

(57) ABSTRACT

A transfer system for moving one or more articles between a conveyor and a station. The system includes a transfer assembly having a lifting mechanism configured to engage the article as it is carried by the conveyor, lift the article to a raised position above the support and lower the article from the raised position to the conveyor. The assembly also includes a displacement device configured to move the article from the raised position to a station, position the article at the station, and return the article from the station to the raised position above the conveyor. The system also includes the method of transferring an article between a conveyor having a pair of spaced rails and a station positioned to one side of the conveyor. The method includes engaging the underside of the article between the rails and lifting the article to a raised position and moving the article in a direction perpendicular to the conveyor between the raised position and a position vicinal the station.

16 Claims, 19 Drawing Sheets

IN/OUT LOAD PORT TRANSFER MECHANISM

CROSS REFERENCE TO RELATED APPLICATIONS

This application claims priority to U.S. provisional patent application Ser. No. 60/112,947 filed Dec. 18, 1998, the entire disclosure of which is hereby incorporated by reference.

BRIEF DESCRIPTION OF THE INVENTION

The present invention relates in general to a system of transferring an article to a load port and, more particularly, to a system of moving an article between a conveyor and a load port.

BACKGROUND OF THE INVENTION

Automated transfer systems are used in a variety of applications to transport articles. The articles are typically loaded onto the transfer system using automated equipment which controls the flow of the articles. Automated equipment is also used to remove the articles at the exit point, with the transfer system and/or removal equipment being designed to allow several articles to accumulate near the contact point to prevent collisions between adjacent articles. With some applications, including semiconductor processing, the articles must be temporarily moved from the transfer system to a station, such as a work station, at one or more locations along the transfer system path. The articles are later returned to the transfer system, which then transports the articles to the next work station or the exit point. Moving the articles between the transfer system and work stations along the path can be complicated as care must be taken to ensure the transfer is accomplished without significantly interrupting the operation of the transfer system. A system for efficiently and conveniently transferring articles between a transfer system and a work station, without interfering with operation of the transfer system, is desirable.

One example of a field in which articles are temporarily removed from the transfer system at intermediate locations is the field of semiconductor processing. In this field, a transfer system may be used to transport semiconductor wafers or other substrates to several different processing machines. The wafers must be transferred to the machine for processing and, after processing has been completed, returned to the transfer system for delivery to the next processing machine. The wafers are typically retained in a protective container such as a sealed transport device or pod, to minimize any exposure of the substrates to the environment outside of the processing machines and protect the wafers against particulate contamination. The entrance of each processing machine is provided with a load port designed to automatically remove the wafers from the transport pod in a protected environment. During operation of the facility, transport pods must be frequently moved between the load port and transfer system.

Typically, the semiconductor manufacturing facility is organized into a plurality of bays each including several processing machines. Various systems are employed to move the transport pods between the machines within a bay. For example, many systems rely upon human workers to transfer the transport pods from port to port using a cart. The worker typically actuates a manual robotic link or other lifting device to move the pod to the port and, after processing has been completed, to return the transport pod to the cart. The process is repeated at the next machine. Another system of intra-bay transport relies upon automatic guided vehicles (AGVs) which carry the pods between the machines and automatically move the pods into the load port. The human propelled cart and AGV avoid the problem of transferring the pod to the load port without interrupting operation of the transfer system. However, the cart and AGV also lack the advantages associated with an automated transfer system, which can efficiently and rapidly move articles along a transfer system path.

Overhead transfer systems are also used to transport pods along the intra-bay loop. The pods are transferred to the load ports by hoists or similar devices which lower the pods onto the port. In order to successfully transfer the pod from the transfer system to the machine, the pod must be precisely aligned with the load port and lowered onto the port in a controlled manner such that any swing of the pod is minimized. After processing, the hoist or other device must engage the pod and lift the pod to the transfer system for transport to the next machine. Using a hoist or similar device to transfer the pod to the load port is complicated, and this method may be used only when the transfer system is positioned above the load port. The overhead transfer system can be difficult to maintain. Moreover, with the overhead transfer system, any particulate contamination or debris generated or carried by the transfer system will be introduced into the bay environment above the machines and load ports. Thus, there is a risk that these contaminants could fall or drift into the load port or other sensitive areas of the machines. Positioning the transfer system at the level of or below the load port reduces this risk. However, the hoist devices may not be used to transfer the pods to the load port from a transfer system which is positioned at or below the level of the port. A system for transferring an article to a workstation from a transfer system located in front of the load port is desirable.

Semiconductor wafers are delicate and, particularly in the later stages of processing, quite valuable. Integrated circuits are manufactured by forming a plurality of layers on a semiconductor wafer or other substrate. With advances in technology, integrated circuits have become increasingly complex and typically include multiple layers of intricate wiring. The number of integrated circuits positioned on a single wafer has increased due to the decreasing size of the integrated circuits. The standard size of the semiconductor wafers will increase from 200 mm to 300 mm or larger in the next few years, further increasing the number of integrated circuits which may be formed on a single wafer. As a result of the increased complexity and decreased size of the integrated circuits, the value of the semiconductor wafer increases substantially as the wafer progresses through the various processing stages. Thus, considerable care must be taken in handling the semiconductor wafers, particularly during the later processing stages, since damaged wafers could result in considerable monetary losses. The requirement of a clean room environment, substantially free of particulate contamination, for processing the wafers places further restraints on the systems which may be used to transfer the pods. A system for transferring articles between a transfer system and load port which is suitable for operation in a clean room environment is desirable.

A transfer system for moving articles, such as semiconductor wafers, transport pods carrying semiconductor wafers, or other containers, between a transfer system and a load port or other work station is desirable. A transfer system which may be used in field other than semiconductor processing, including but not limited to pharmaceuticals, medical systems, flat panel displays, computer hardware as for example disc drive systems, modems and the like, semiconductor wafers and lithography reticles is also desirable.

OBJECTS AND SUMMARY OF THE INVENTION

It is a primary object of the present invention to provide a system for transferring articles between a conveyor and a work station.

It is a further object of the present invention to provide a system for moving articles between a conveyor and a work station in a clean room environment.

It is another object of the present invention to provide a transfer system which may be used to automatically transfer articles between the conveyor and work station without significantly interrupting operation of the conveyor.

It is yet another object of the present invention to provide a transfer system for moving a transport pod or other container retaining a plurality of semiconductor wafers between a conveyor and the load port of a processing machine.

A more general object of the present invention is to provide a transfer system which may be efficiently constructed, operated and maintained, and is compatible with a variety of standard load ports.

In summary, the present invention provides a transfer system for moving an article between a conveyor and a station. For example, the article may be a transport device such as a pod or other container housing one or more articles (herein referred to in the singular as well as the plural) such as semiconductor wafers and the station may be a semiconductor processing machine or work station. Alternatively, the transfer system may be used to transport empty containers. The system includes a transfer assembly for moving the article. The transfer assembly generally includes a lifting mechanism configured to engage the article carried by the conveyor and lift the article to a raised position above the conveyor. The lifting mechanism is also configured to lower the article from the raised position to the conveyor when the article is returned. The transfer assembly also includes a displacement device configured to move the article from the raised position above the conveyor to a station, to position the article at the work station, and to return the article from the station to the raised position above the conveyor.

The transfer system of this invention also includes the method of transferring an article between a conveyor having a pair of spaced rails and a station positioned to one side of the conveyor. The method includes the steps of engaging the underside of the article between the rails and lifting the article to a raised position, and moving the article from the raised position to a position vicinal the station.

Additional objects and features of the invention will be more readily apparent from the following detailed description and appended claims when taken in conjunction with the drawings.

BRIEF DESCRIPTION OF THE DRAWINGS

FIG. 3a is a sectional view taken substantially along line 3a—3a of FIG. 2a.

DETAILED DESCRIPTION OF THE INVENTION

Figure 1:
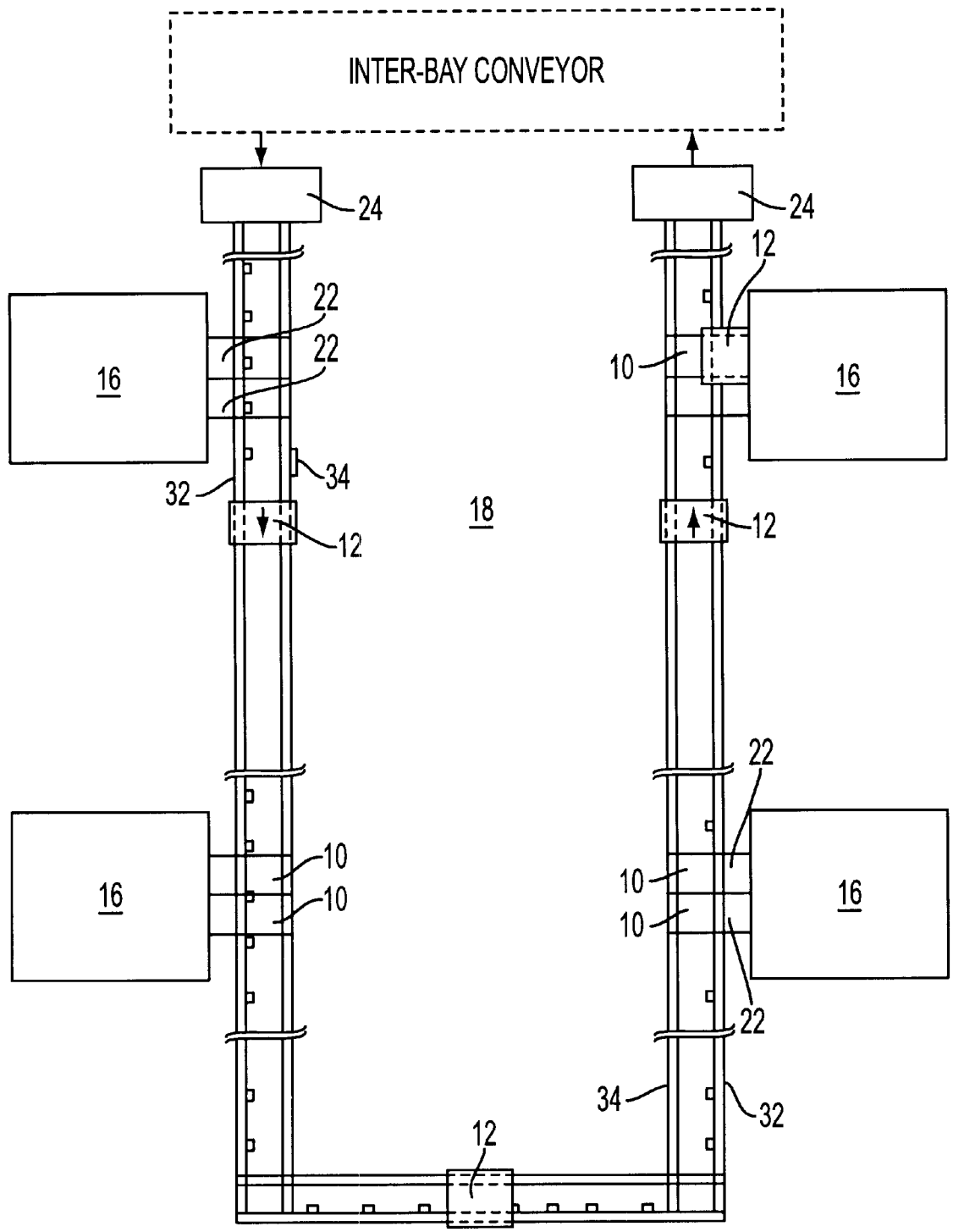
FIG. 1 is a schematic view of an example of a conveyor system incorporating a transfer assembly in accordance with the present invention.

Reference will now be made in detail to the preferred embodiments of the invention, which are illustrated in the accompanying figures. Turning now to the drawings, wherein like components are designated by like reference numerals throughout the various figures, attention is directed to FIGS. 1–3.

The transfer assembly 10 of this invention is particularly suitable for transferring one or more articles 12 between a conveyor 14 and a station 16, such as a workstation. In one application, described in the illustrated embodiments of the invention, the transfer assembly 10 is used to move transport pods or other containers housing semiconductor wafers W between a conveyor and a processing machine. However, it is to be understood that the transfer assembly 10 is not to be limited to semiconductor processing. Instead of wafer transport, the transfer assembly may be used to transfer other types of materials, particularly delicate materials where substantial care must be taken in handling the materials such as pharmaceuticals, medical systems, flat panel displays, hard disk drives and other types of computer equipment, and lithography reticles between a conveyor and a station. The term "transport device, or "transport pod" is used throughout the description for convenience; however, it is to be understood that the transfer assembly of this invention may be used with any article, including but not limited to transport pods, containers holding semiconductor wafers or other items, pallets, or articles which may be directly transported by the conveyor without requiring a separate transport device, and empty containers.

In the field of semiconductor processing, the manufacturing facility is typically organized into a plurality of bays each including several processing machines. FIG. 1 shows a possible example of a bay 18 with several processing machines 16 including, but not limited to, equipment for depositing films on the wafers, for cleaning and/or conditioning the wafers at various stages, and the like. As is known in the art, the entrance of the processing machine is often provided with a load port 22 where the wafers may be automatically removed from the transport pod or other container in a protected environment. As described in more detail below, the transfer assembly 10 of this invention deposits the transport pod on the load port 22. Once the transport pod is properly positioned at the load port, the pod is automatically opened and the wafers are extracted from the pod by robotic devices. It is to be understood that the transfer assembly of this invention may be used with work stations 16 which do not include a load port provided that the work station includes a shelf, surface or other support on which the article 12 may be positioned. Alternatively, the transfer assembly 10 may be used to support the article 12 in position at the work station in which case the article 12 would not be deposited on the work station.

The conveyor 14 moves the articles from processing machine 16 to processing machine 16. In the illustrated example, the conveyor 14 is arranged in a continuous path around the bay 18. However, in other path configurations the conveyor 14 may include one or more cross sections which may be used as a short-cut to other areas of the bay 18 or as a holding area to temporarily remove pods from the main conveyor loop without interrupting the traffic flow on the main loop. The configuration of the conveyor 14 is subject to considerable variation depending upon the constraints of a particular manufacturing facility. An inter-bay conveyor transports the pods between the bays, with stockers 24 transferring the pods between the inter-bay conveyor and the conveyor 14.

Figure 2A:
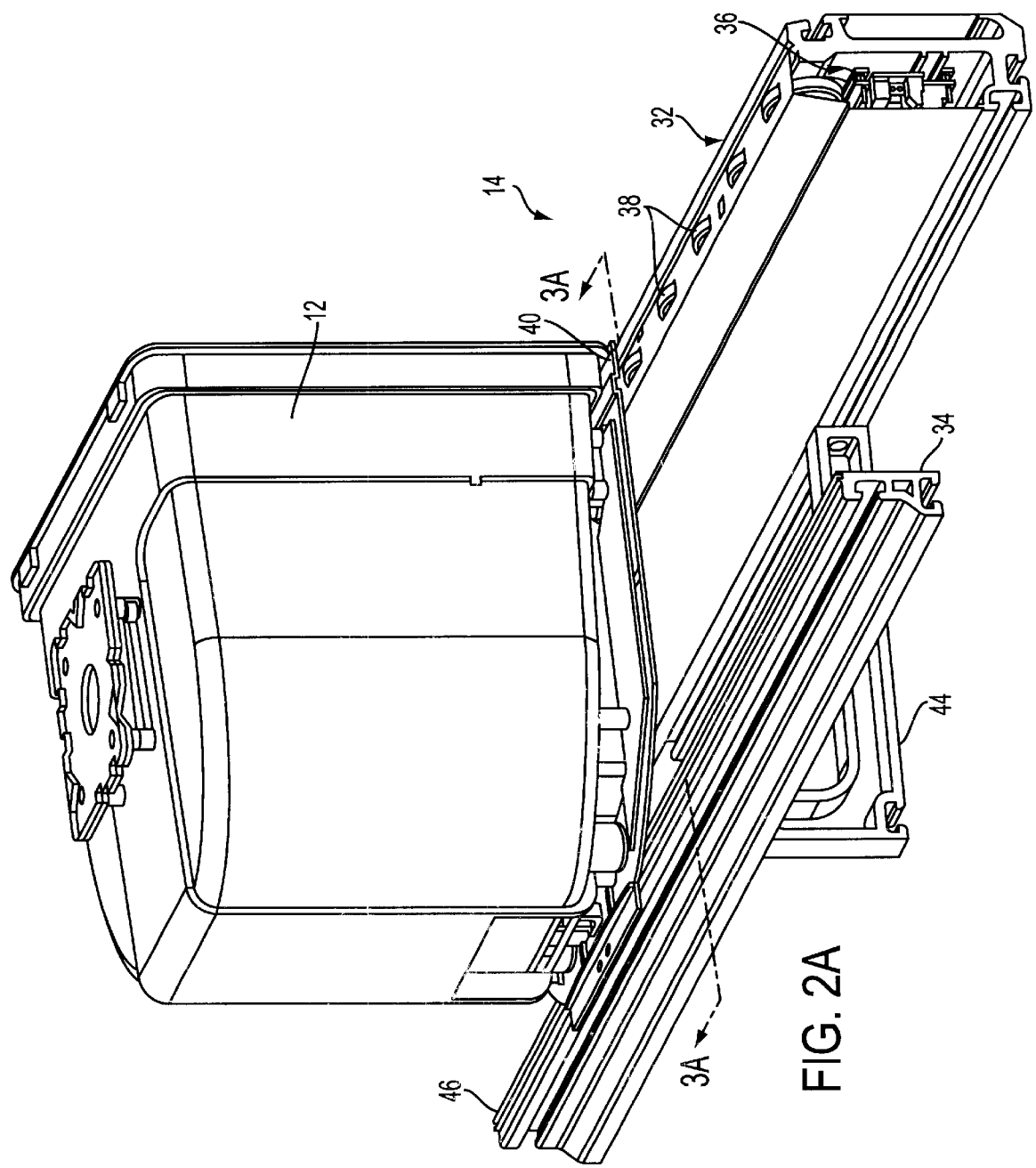
FIG. 2a is a pictorial view of a section of the conveyor system shown in FIG. 1 according to one embodiment of the present invention.

The transfer assembly 10 is particularly suitable for use with a conveyor system of the type shown in shown in co-pending U.S. patent application Ser. No. 09/103,479, the entire disclosure of which is incorporated herein by reference. As shown for example in FIGS. 1–3, the conveyor system 14 generally includes a pair of rails 32, 34 for supporting the transport pod as it is moved along the conveyor path. The rail 32 functions as a drive rail which propels and optionally guides the transport pod 12 along the rails 32, 34. All propulsion power for moving the pod 12 is supplied via the drive rail 32. Power may be supplied to the drive rial 12 via conventional means. Alternatively, power may be supplied to the drive rail 12 by a power bus 21 (shown in FIG. 3a). Rail 34 is an idler or support rail with a primary function of supporting the transport pod such that the pod is held in a level orientation as it is moved along the conveyor path. Optionally, the support rail 34, as opposed to the drive rail 32, may be used to guide the transport pod as it travels along the conveyor system. The conveyor system 14 also includes a transport device for moving the wafers or other materials. In this embodiment, as shown in FIGS. 2 and 3, the transport device is part of the transport pod. In other embodiments of the invention, the transport device may be part of another container or article, or the transport device may be a separate device which may be used to transport materials along the conveyor.

The drive rail 32 includes a drive system, generally designated at 36, for propelling the pod 12 along the rails 32, 34. In the illustrated embodiment of the invention, the drive system 36 includes a plurality of wheels 38 which project from the upper surface of the drive rail 34. The drive wheels 38 frictionally engage the underside of the transport pod to propel the pod along the drive rail 32. The drive system 36 also includes means for driving the wheels such as motors and belts coupled to the wheels. Preferably, the motors operate independently to provide a plurality of independently controlled drive zones such that the drive speed and direction (forward or reverse) of each zone may be independently controlled. The wheels 38 of adjacent operational zones are accelerated and decelerated at the same rate such that at the time of transfer, the speed imposed on the transport pod by the wheels in adjacent zones is synchronized at the time of transfer between the zones. As the pod is propelled along the conveyor, only the operational zone directly below a pod and one or more zones adjacent the pod are active at any time. This reduces the power consumption of the system and extends the operational life of the components of the drive system 36. The drive zones below and adjacent to other pods may be held in a stationary or inactive mode, allowing a plurality of pods to accumulate in an area of the conveyor, such as before one of the processing machines 16. The pods may be separated by at least one empty zone, in which there is no pod, or alternatively the pods may reside in adjacent zones. The operation of the drive system 36 is controlled by a control system. The control system also preferably includes one or more sensors to monitor the progress of the pods along the conveyor. The control system is more fully described in co-pending U.S. patent application Ser. No. 09/212,002, the entire description of which is herein incorporated by reference.

As shown in FIG. 3, the drive wheel 38 cooperates with the transport device, which in this embodiment is part of the transport pod, to propel and optionally to guide the pod along the path. The drive wheel 38 engages a groove 40, or other suitable surface, formed in the underside of the pod. The groove 40 defines the horizontal plane in which the pod sits on the drive wheels 38. The engagement between the drive wheels 38 and the groove 40 controls lateral or side-to-side movement of the pod as well as vertical movement of the pod. While the combination of the groove 40 and drive wheels 38 is preferred, it is to be understood that the groove 40 may be eliminated entirely provided the transport device, drive rail 32 or idler rail 34 include a guiding device for guiding the pod as it moves along the rails 32, 34. In an alternative embodiment, the idler rail 34 guides the transport device, that is it cooperates with the transport device to constrain movement of the device in both the vertical and lateral directions and in this instance the drive rail 32 would constrain only the vertical movement of the transport device.

The idler rail 34 is parallel to and spaced from the drive rail 32. One or more connectors 44 are mounted to the drive and idler rails 32, 34 to maintain a predetermined spacing between the rails and facilitate installation of the conveyor. The drive rail 32 and connectors 44 may be mounted to a suitable mounting frame or suspended from the ceiling by an overhead frame (not shown), or supported directly or indirectly by the process tool or work station. The pod rides along the upper surface of the idler rail 34, with the idler rail 34 cooperating with the transport device to support one side of the transport pod. In the illustrated embodiment, a pad or cushion material 46 is provided along the upper surface of the rail 34 to provide the pod with a smoother ride although if desired the pad 46 may be omitted and the pod may ride directly on the upper surface of the rail 34. Alternatively, a pod, cushion or resilient material may be incorporated into the outer perimeter of the drive wheels. At least one shoe 48 carried by the transport device, here the transport pod, rides along the upper surface of the idler rail 34. The shoe 48 is preferably provided by a wheel, although the shoe may also take other forms including, but not limited to, a fixed support having an anti-friction plastic surface, an air bearing and a magnetic levitation bearing. As the pod is propelled along the conveyor 14, the shoe 48 rides along the idler rail 34 to support the pod in a manner which minimizes bumping, jolting or shimmying of the pod, allowing the pod to be moved in a smooth, controlled manner.

Figure 2B:
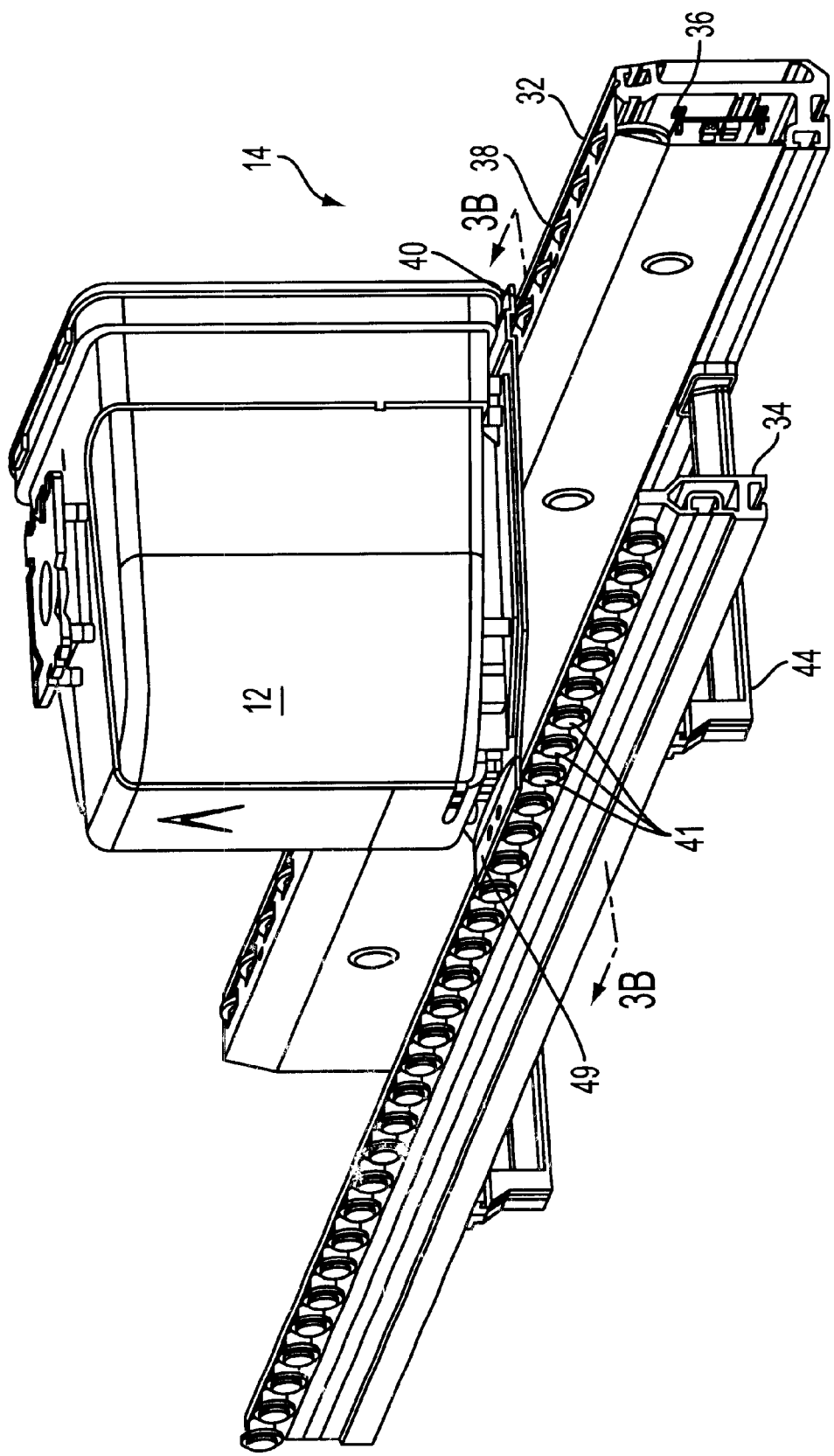
FIG. 2b is a pictorial view of a section of the conveyor system shown in FIG. according to an alternative embodiment of the present invention.
Figure 3A:
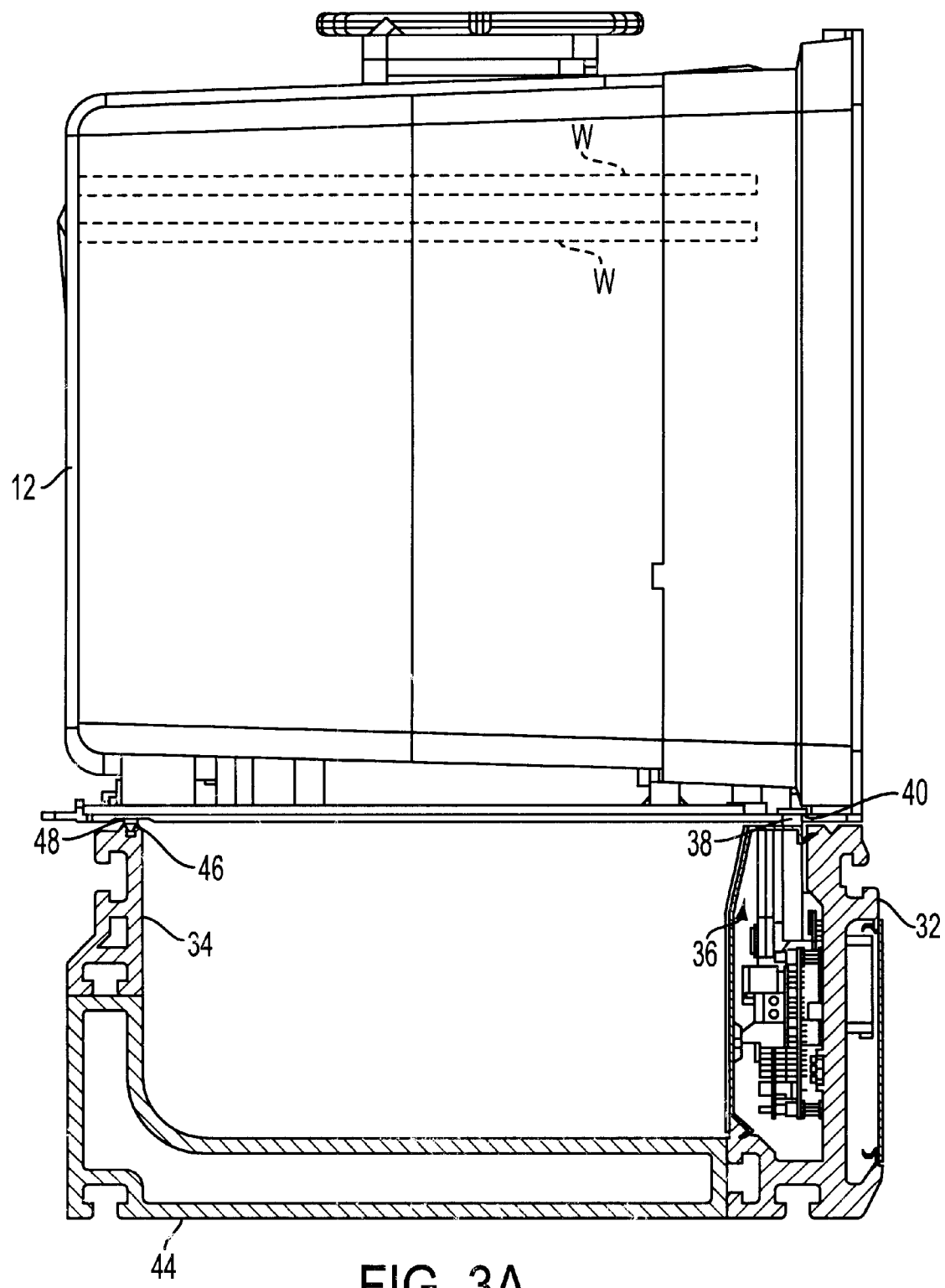
Figure 3B:
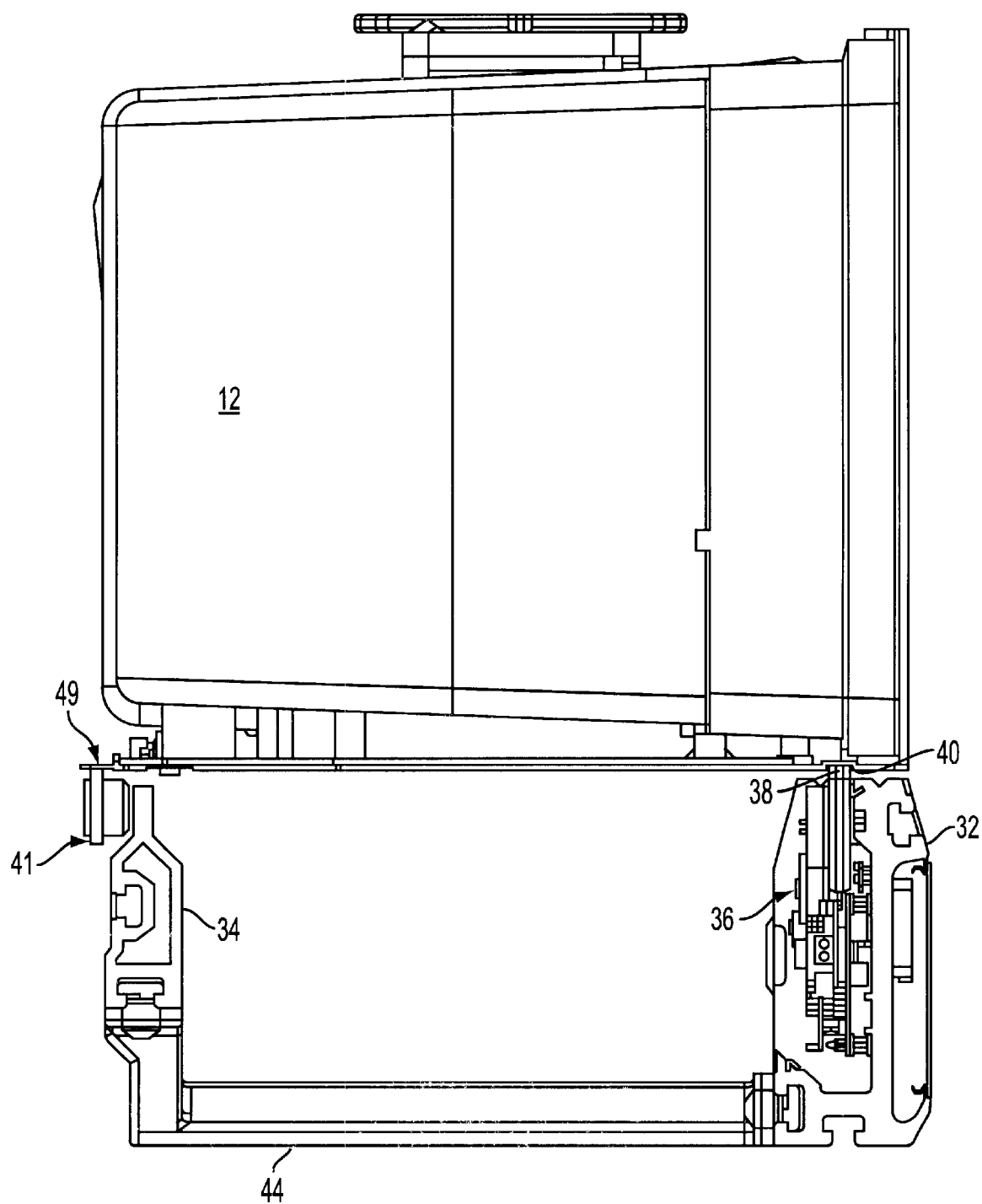
FIG. 3b is a sectional view taken substantially along line 3b—3b of FIG. 2b.

In another alternative embodiment shown in FIGS. 2b and 3b, the shoe 48 is provided by a fixed support 49. In this embodiment, the idler rail 34 includes a plurality of rollers 41 for supporting the fixed support 49. The rollers 41 support the fixed support 49 on the underside of the transport pod as it travels along the idler rail 34. Preferably, the fixed support 49 will have an anti-friction plastic surface. In yet another embodiment, the idler rail 34 provides guidance as well as supporting the transport device. To provide guidance, the shoe 48 or the idler rail 34 includes a guiding device. One example where a guiding device is incorporated into the idler rail is with the use of a v-rail. Alternatively, the shoe may incorporate a guiding device. For example, the shoe 48 may be provided by a fixed support having a groove formed therein (not shown) which engages the rollers 41 on the idler rail 34. It should be understood that while specific embodiments of the shoe are described, the shoe 48 may take many other forms which provide the function of supporting, or supporting and guiding, the transport device.

Although in the preferred embodiment the transfer assembly 10 is used with the conveyor system 14 of co-pending application Ser. No. 09/103,479, it is to be understood that the transfer assembly 10 may also be used with other types of conveyors.

The transport pods 12 are automatically moved from the conveyor 14 to the work station 16 for processing, measuring, and/or simply for storage, and then returned to the conveyor 14 by the transfer assembly 10. As discussed above, the transfer assembly 10 is particularly suitable for use in the field of semiconductor processing, but may also be used for other applications within the scope of this invention. In the illustrated embodiment, where the transfer assembly 10 is used with the conveyor 14, the transport pod 12 must be disengaged from the conveyor; that is, the pod 12 must be sufficiently raised above the drive and idler rails 32, 34 so that the groove 40 clears the drive rail 32 and the shoe 48 clears both the drive and idler rails 32, 34. After the pod 12 is returned to the conveyor, the transport pod must be accurately aligned with the conveyor 14 so that the groove 40, or other suitable surface, seats on the drive wheels 38 and the shoe 48 seats on the idler rail 34. Alignment of the pod 12 with the load port 22 also must be precisely controlled. As is known in the art, the load port 22 includes a plurality of kinematic pins 23 (FIG. 4) which engage slots (not shown) on the underside of the transport pod. The use and description of the kinematic pins or couplings used to align transport pod is referenced in certain Semiconductor Equipment and Material International (SEMI®) industrial standards, such as but not limited to SEMI E47.1-0298, SEMI E57-0298, SEMI E15.1-0298 and SEMI E19.4-94, the relevant provisions of which are herein incorporated by reference. Before the transport pod 12 is lowered onto the load port 22, the slots must be carefully aligned with the kinematic pins 23 on the load port. One or more sensors on the conveyor (not shown) verify the accurate placement of the transport pod 12 on the conveyor in a load/unload position for transfer of the pod between the conveyor and load port by the transfer assembly 10. The transfer assembly 10 is described in more detail in relation to FIGS. 4–8.

The transfer assembly 10 generally includes a support 60 which is coupled to a lift mechanism 62. In the embodiment shown in FIGS. 4–8, the support 60 extends between the conveyor 14 and the work station 16. The support 60 includes a first portion 64 which engages the underside of the pod 12 and lifts the pod from the conveyor 14 and a second portion 66 which supports the pod as the pod is lowered onto the load port 22. The first portion 64 is shaped complementary to the configuration of the conveyor 14; that is, the first portion 64 is shaped to accommodate the drive and idler rails 32, 34 when the support 60 is raised relative to the conveyor. In the illustrated embodiment, the first portion 64 is substantially positioned between the drive and idler rails 32, 34. Pockets 70 are shaped to receive the drive and idler rails 32, 34, preferably without contacting the rails, such that the first portion 64 engages the underside of the pod 12 in the area between the rails. However, in other embodiments of the invention the first portion 64 of the support may extend outwardly of the idler rail 34 to lift a portion of the pod 12 which extends beyond the idler rail 34. This configuration may be desirable where the drive and idler rails 32, 34 are positioned closer together, or where the transport pod 12 or other device is substantially wider than the spacing between the rails 32, 34. It is to be understood that the shape of the first portion 64 of the support 60 is substantially determined by the spacing between the rails and how the pod 12 is seated on the rails.

The second portion 66 of the support 60 is shaped complementary to the configuration of the load port 22. In the illustrated embodiment, shown particularly in FIG. 4, the second portion 66 is provided by a pair of cantilevered legs which are positioned on opposite sides of the load port 22. This configuration allows the second portion 66 of the support to be raised above the surface of the load port when the pod is moved from the conveyor to the processing machine. When the pod is vertically aligned with the load port 22, the pod 12 may be deposited on the load port by lowering the support 60 to move the surface of the second portion 66 below the surface of the load port. The configuration of the second portion 66 of the illustrated embodiment is of particular advantage in that it does not require substantial modification of existing load ports provided the port is narrower than the width of the transport pod 12. However, it is to be understood that the second portion 66 may have other configurations within the scope of this invention and the invention is not limited by the specific illustrated embodiment just described. For example, the load port may be provided with one or more inward-extending slots and the second portion 66 may be positioned in the slots.

Figure 5:
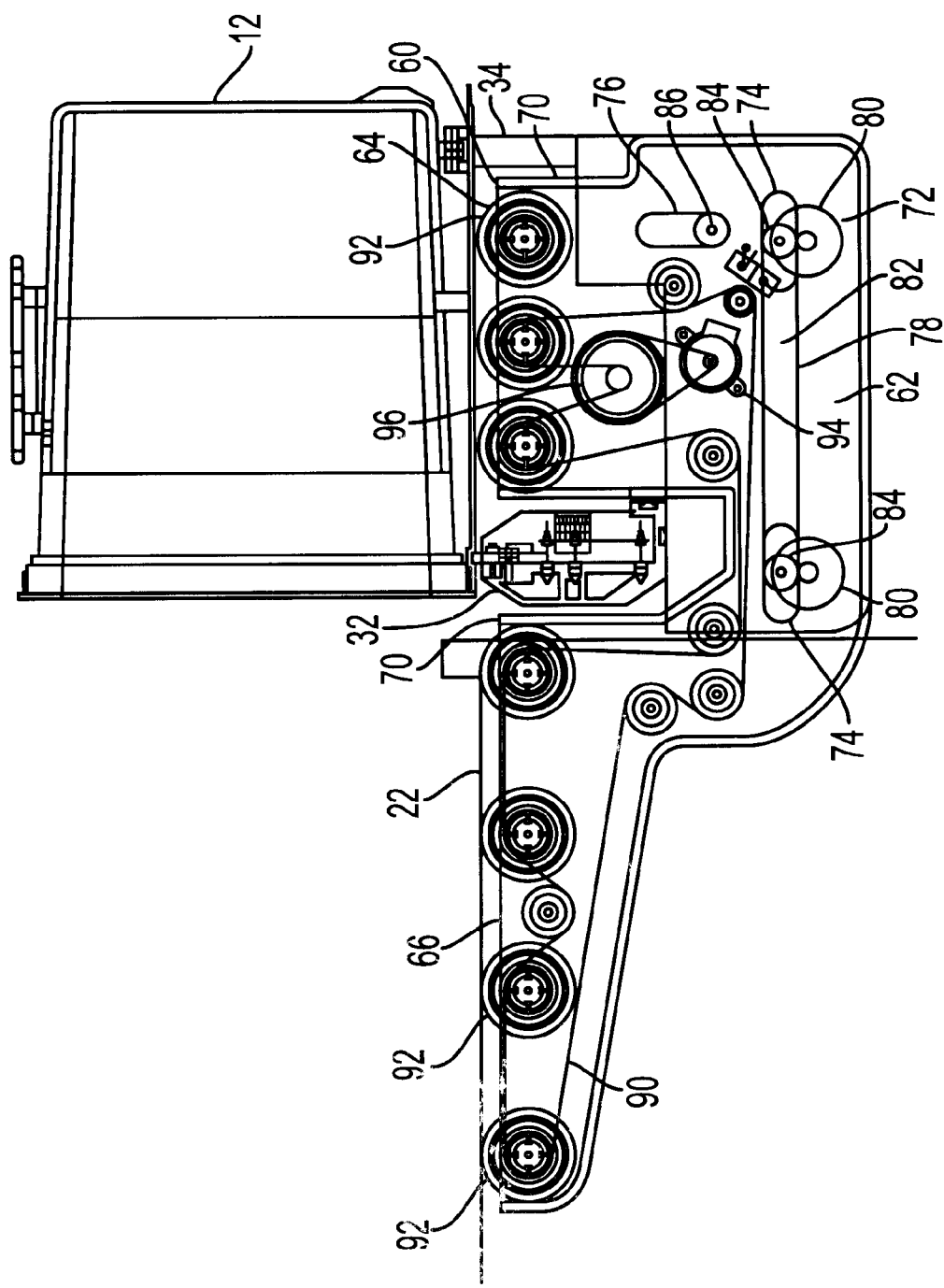
FIGS. 5–8 are sectional views of the transfer assembly of FIG. 4, showing the movement of the transport pod from the conveyor to the work station.

In the illustrated embodiment, as shown particularly in FIG. 5, the second portion 66 is integrally formed with the first portion of the support 60. If desired, the first and second portions may be provided by separate components which are secured together using suitable mounting devices or by separate components which are individually mounted to the lift mechanism 62 so that one lifting mechanism may be used to simultaneously raise and lower the first and second portions 64, 66. Alternatively, the first and second portions 64, 66 may be separate components which are individually lifted by different lift mechanisms. This alternative may be useful in applications where the pod or other article is held at the work station by the second portion support 60 instead of a load port or similar structure, allowing the first portion of the support to be lowered so that the first portion will not interfere with operation of the conveyor.

The lift mechanism 62 controls the raising and lowering of the support 60 relative to the conveyor 14 and load port. The lift mechanism generally includes a pair of fixed plates 72 which are mounted to a suitable frame (not shown). The plates 72 may be mounted to the same frame which supports the conveyor 14 or to a separate frame. The plate 72 includes horizontal guide slots 74 and a vertical guide slot 76. As shown particularly in FIGS. 5–8, the lift mechanism 62 also includes a cam assembly 78 for lifting the support 60. The cam assembly 78 includes a pair of spaced apart rotors 80 mounted to the support 60 and a cam linkage 82 extending between and coupled to the rotors 80 via pins 84 carried by the rotors 80. The pins 84 extend through the horizontal guide slots 74 formed in the fixed plate 72. The pins 84 slide along the guide slots 74 as the pins 84 are moved in a circular path by the rotation of the rotors 80. A guide pin 86 carried by the support slides along the vertical guide slot 76 to ensure the support 60 is moved up-and-down in a vertical direction with little or no lateral rocking of the support. Alternatively, the lift mechanism 62 may be comprised of several synchronized lead screws with a single motor drive (not shown). Further, the lift mechanism may be comprised of other suitable components instead of those given in these specific examples, such as a linkage system or pneumatic cylinder system.

Figure 6:
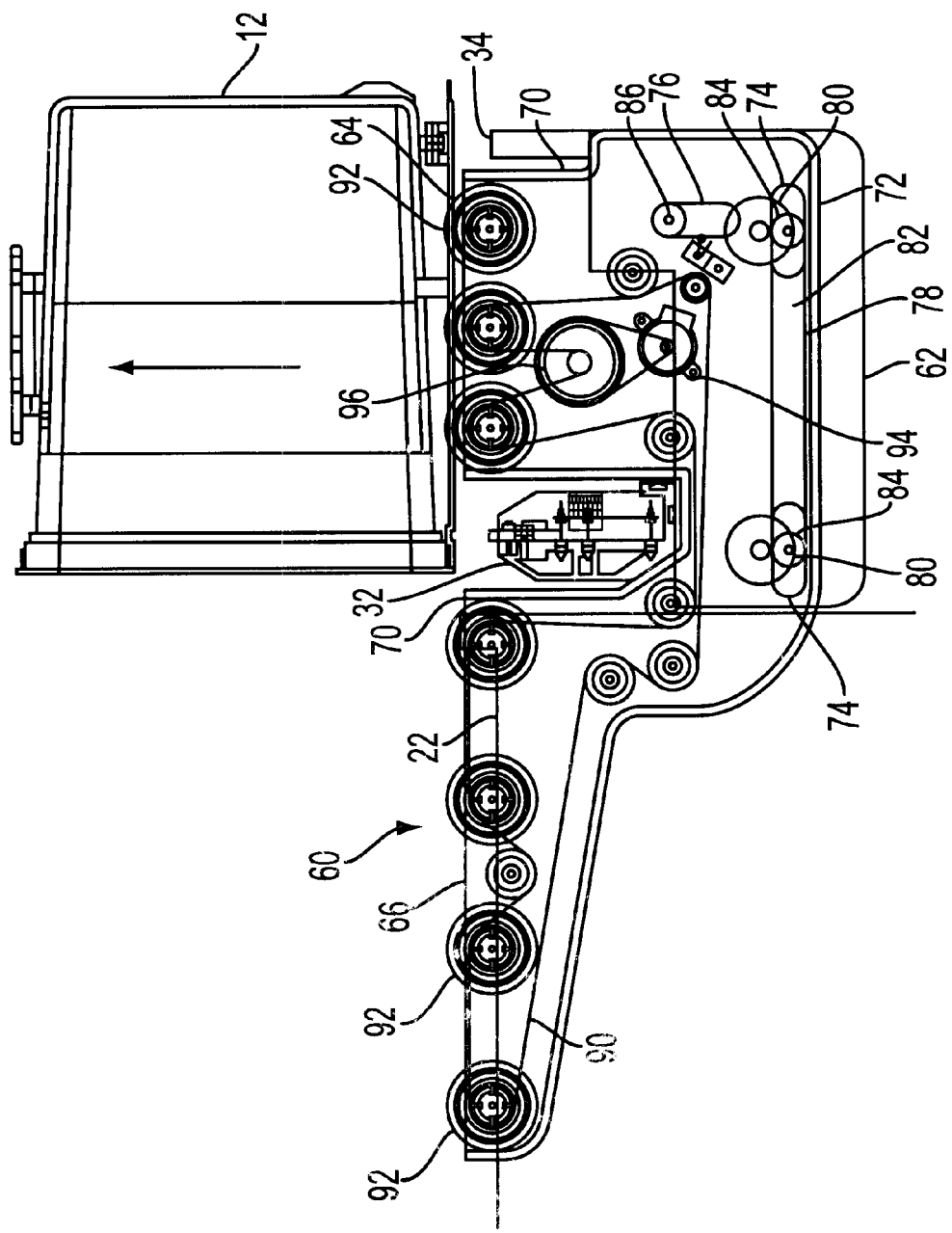
Figure 7:
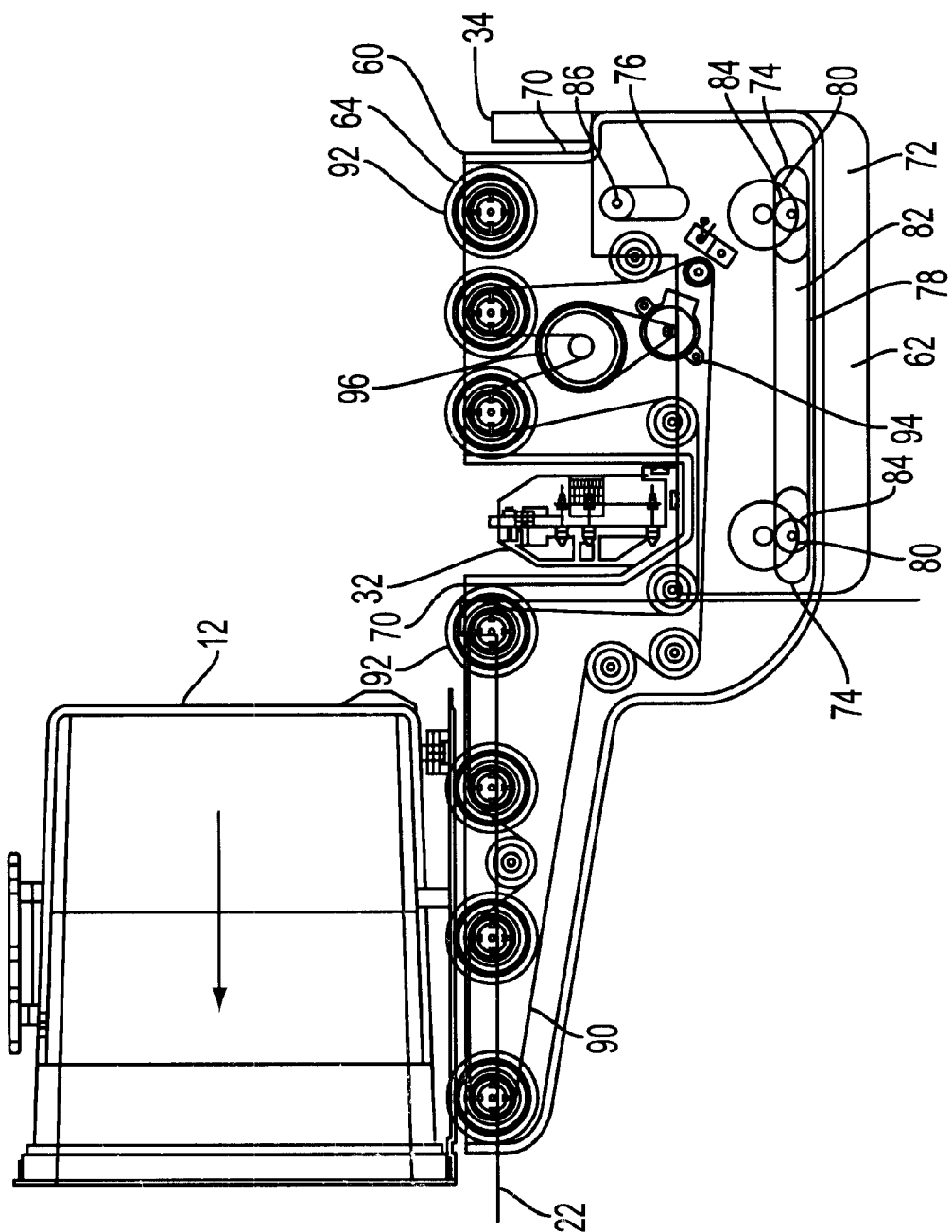

FIG. 5 shows the support 60 in the lowered position, with the rotors 80 oriented such that the pins 84 are positioned above the central axis of the rotors. Rotation of the rotors 180° in either direction moves the pins 84 to a position below the axis of the rotors 80 as shown in FIG. 6. As the pins 84 travel between the positions shown in FIGS. 5 and 6, the pins 84 travel along the slots 74 and raise the support 60 relative to the fixed plate 72 to lift the pod 12 above the level of the conveyor 14. The support 60 is lowered by rotating the rotors 180° to return the pins 84 to the position above the rotor axis, shown in FIG. 8.

The transfer assembly 10 further includes a displacement system 90 for moving the transport pod 12 from the conveyor 14 to a position above the load port, and to return the pod 12 to the conveyor 14 after processing or other purposes have been completed. In the illustrated embodiment, a plurality of wheels 92 are provided along the support 60. As shown particularly in FIGS. 6 and 7, the transport pod 12 is directly supported on the wheels 92. The wheels 92 are arranged in two parallel rows to support the opposite sides of the transport pod 12. The wheels 92 are coupled to a motor 94 via a reduction gear 96 and an endless belt 98 which drives the wheels 92 to propel the transport pod 12 across the support 60 to the second portion 66 of the support. The motor 94 also operates in reverse to drive the wheels 92 in the opposite direction and return the transport pod 12 to the first portion 64 of the support 60. The wheels 92 on both sides of the support 60 may be driven by the same motor or by different motors. It is to be understood that other means may be used to power the wheels 92 or to propel the transport pod 12 across the support 60.

Although not shown, the rotors 80 and motor 94 are coupled to a control device which controls the activation and operation of the lift mechanism and displacement system. The control device is preferably coupled to the control system of the conveyor 14 to synchronize the operation of the transfer assembly and conveyor. One or more sensors (not shown) may also be provided to detect the position of the transport pod 12 on the support.

Figure 8:
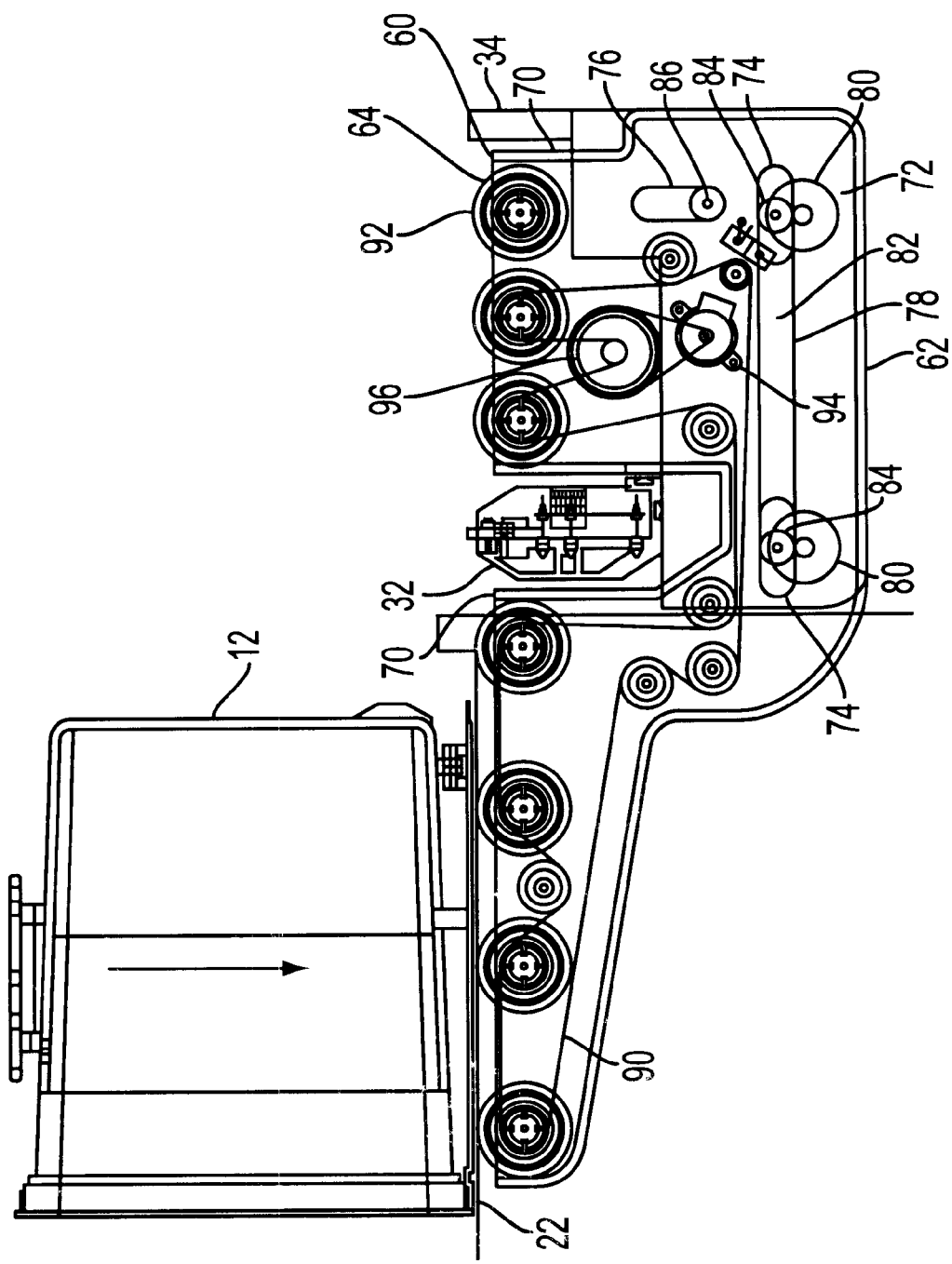

The sequence of operation of the transfer assembly 10 of the illustrated embodiment is shown in FIGS. 5–8. In FIG. 5, a transport pod 12 has been moved to a position in front of the load port 22 by the conveyor 14. The rotors 80 are activated to raise the support 60 to the position shown in FIG. 6. As the support 60 is moved upward, the support engages the underside of the transport pod 12 and lifts the transport pod 12 above the level of the conveyor 14. Once in the raised position, the motor 94 is activated to rotate the wheels 92 in a forward direction to propel the transport pod 12 across the support 60 from the position shown in FIG. 6 to the position shown in FIG. 7 where the transport pod 12 is substantially aligned with the kinematic pins on the load port 23. When the transport pod 12 is positioned on the second portion 66 of the support 60, the rotors 80 are activated to lower the support 60 and deposit the transport pod 12 on the load port 22 as shown in FIG. 8.

Figure 4:
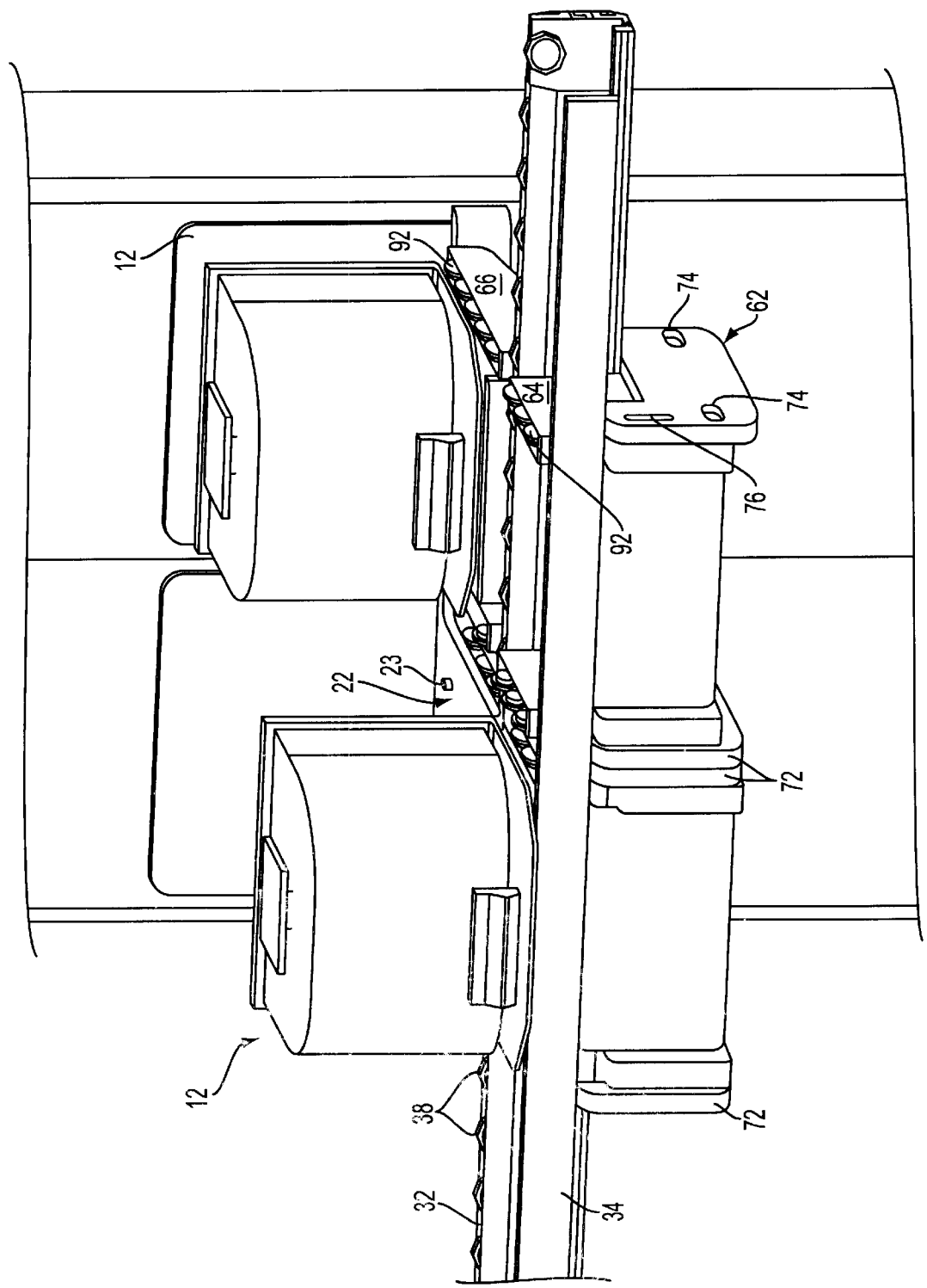
FIG. 4 is a pictorial view of a pair of transfer assemblies in accordance with the present invention.

After the transport pod 12 has been moved onto the load port 22, the support 60 remains in the lowered position shown in FIG. 8 allowing one or more transport pods 12 to travel along the conveyor 14 without interference. Thus, the transfer assembly 10 provides a convenient and efficient means of transferring pods to the work station without interrupting the operation of the conveyor 14. This feature is of particular advantage where a processing machine includes multiple load ports as shown in FIG. 4 as the transport pods 12 may be moved past a pod positioned at a load port to an empty load or the next processing machine. This feature is also of advantage where a manufacturing facility may include duplicate machines positioned side-by-side in the processing bay.

After the wafers carried by the transport pod 12 have been processed, the lift mechanism 62 is activated to raise the support 60 so that the support lifts the transport pod 12 from the load port 22. Once the pod is in a raised position, the motor 94 is activated to turn the wheels in the reverse direction and back the transport pod across the conveyor. When the motor is deactivated to halt the movement of the transport pod, the pod is in a position in which the groove 40 or other suitable surface, and shoe 48 on the underside of the pod are substantially vertically aligned with the drive and idler rails 32, 34. The lift mechanism is then activated to lower the support 60 and deposit the transport pod 12 on the conveyor 14 and the conveyor begins to propel the transport pod 12 to the next processing machine.

Figure 9:
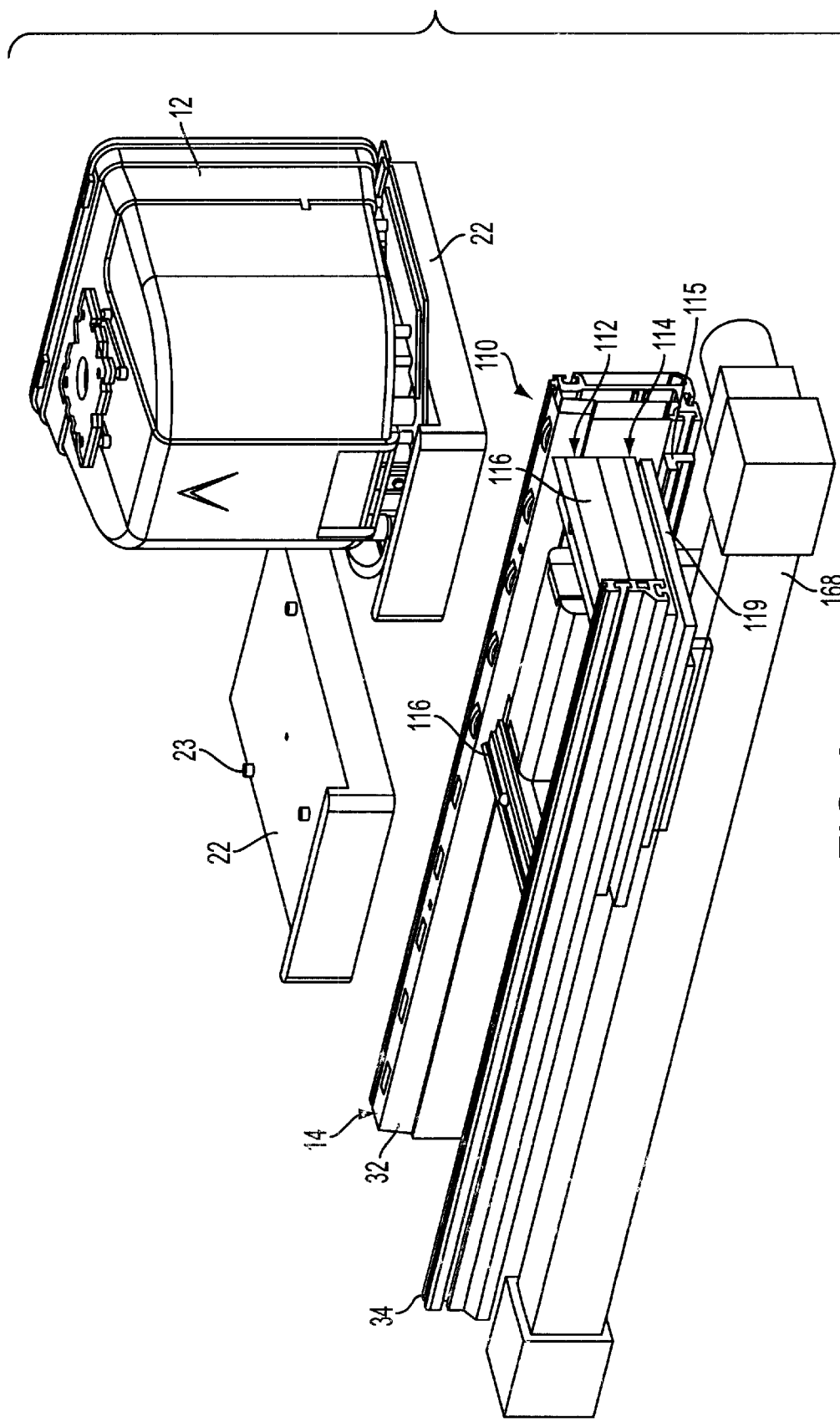
FIG. 9 is a pictorial view of a transfer assembly in accordance with another embodiment of the invention, shown in the retracted position.

With the transfer assembly 10 shown in FIGS. 4–8, the transport pod 12 is lifted above the conveyor by a support which extends from the conveyor 14 to the load port 22. The transport pod 12 is then moved from the conveyor 14 to the load port 22 and back by propelling the pod across the support. FIGS. 9–15 show another embodiment of a transfer assembly 110 for moving the transport pod 12 between a conveyor 14 and a work station. FIG. 9 shows the transfer assembly 110 in a retracted position after a transport pod 12 has been lowered onto the load port 22. In this position, the transfer assembly 110 is below the level of the drive and idler rails 32, 34 so that one or more transport pods 12 may be moved past the load ports 22 while the pod 12 is positioned on one of the load ports. Thus, the transfer assembly 110 does not interfere with the operation of the conveyor 14. In some applications of the invention, such as where the transport pods 12 or other articles are not allowed to skip past work stations or move past other pods 12 or where the transfer assembly 110 also functions to support the article at the workstation, the transfer assembly 110 need not be retracted below the conveyor 14.

The transfer assembly 110 generally includes a support 112 and a displacement assembly 114 moving the support 112 by raising and lower the support 112 relative to the levels of the conveyor 14 and load port 22 and extending and retracting the support 112 between the conveyor 14 and the load port 22. To return the transport pod 12 to the conveyor the displacement assembly 114 is actuated to move the support 112 from the retracted position shown in FIG. 9 to the raised position shown in FIG. 10. Next, the displacement assembly is actuated to move the support 112 to the extended position shown in FIGS. 11 and 12, positioning the support 112 under the transport pod 12 on either side of the load port 22. The displacement assembly 114 is then actuated to raise the support 112 relative to the load port 22 such that the support 112 engages the underside of the transport pod 12 and lifts the transport pod above the load port 22. The support 112 is then retracted by the displacement assembly 114 to the position shown in FIG. 13 and then lowered to the position shown in FIG. 14, with the transfer assembly 110 retracted below the level of the conveyor 14 and the transport pod 12 positioned on the drive and idler rails 32, 34.

Figure 10:
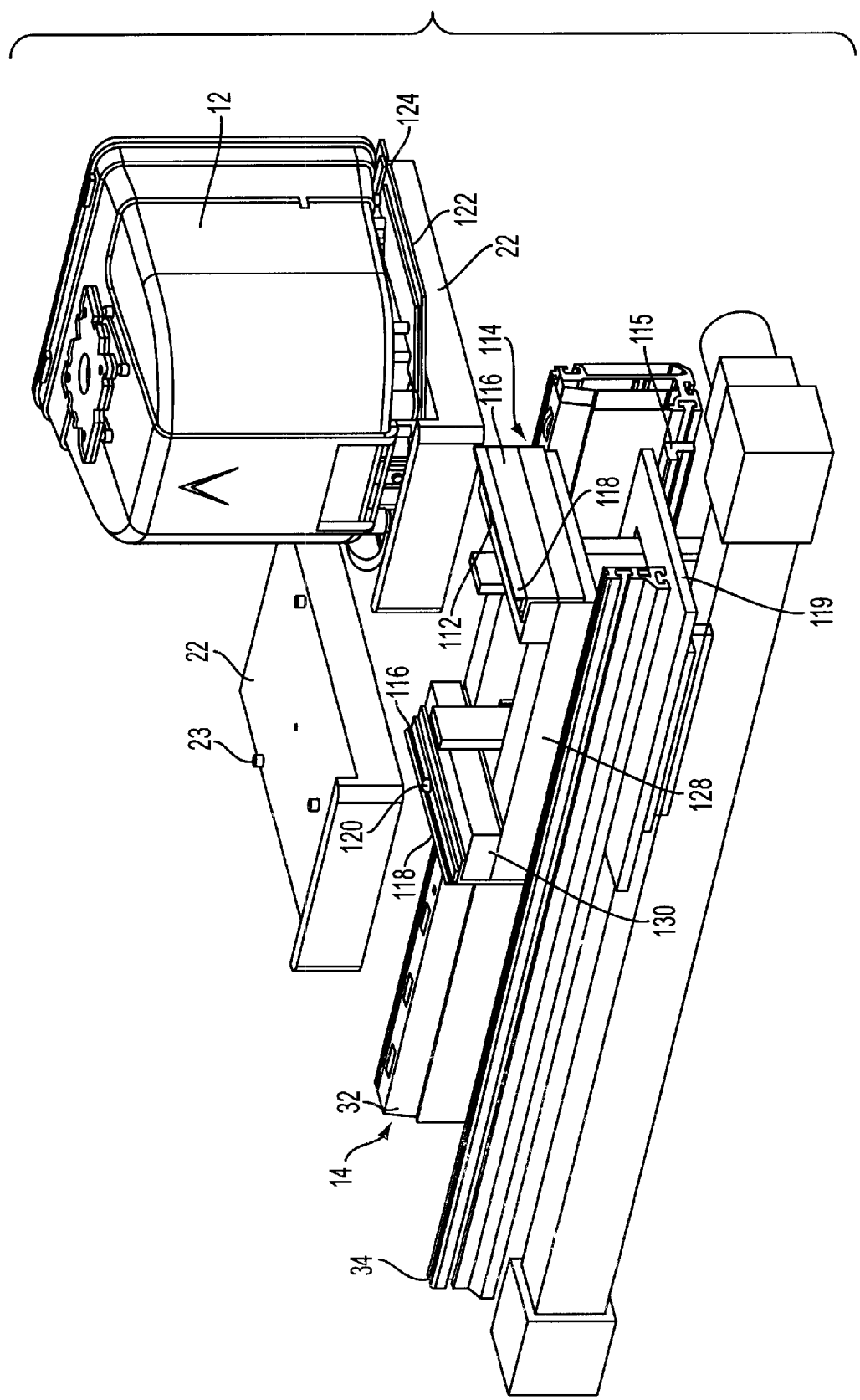
FIG. 10 is a side plan view of the transfer assembly of FIG. 9, shown in a raised position.
Figure 11:
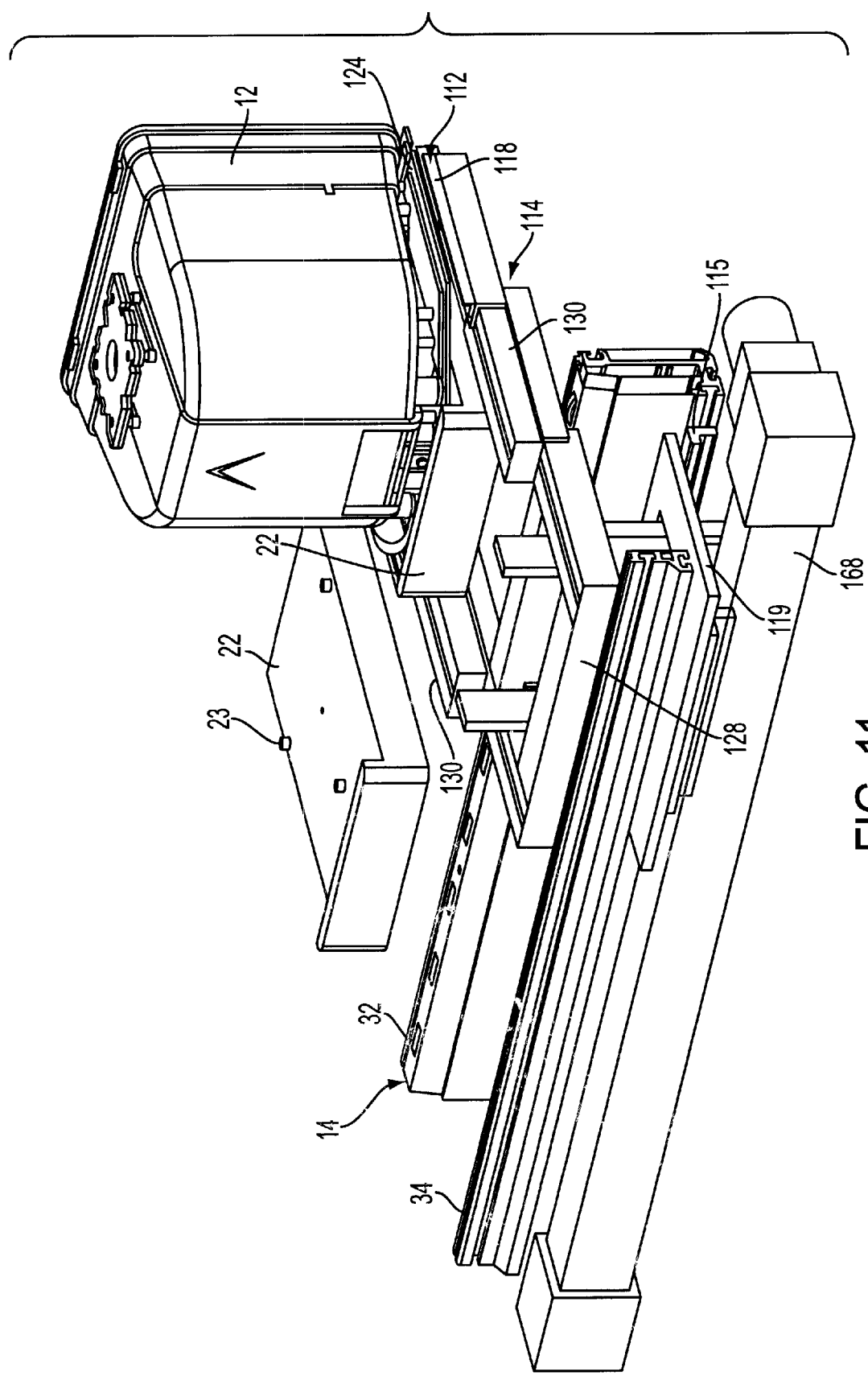
FIG. 11 is a pictorial view of the transfer assembly of FIG. 9, shown in the extended position prior to lifting a transport pod from a load port.
Figure 12:
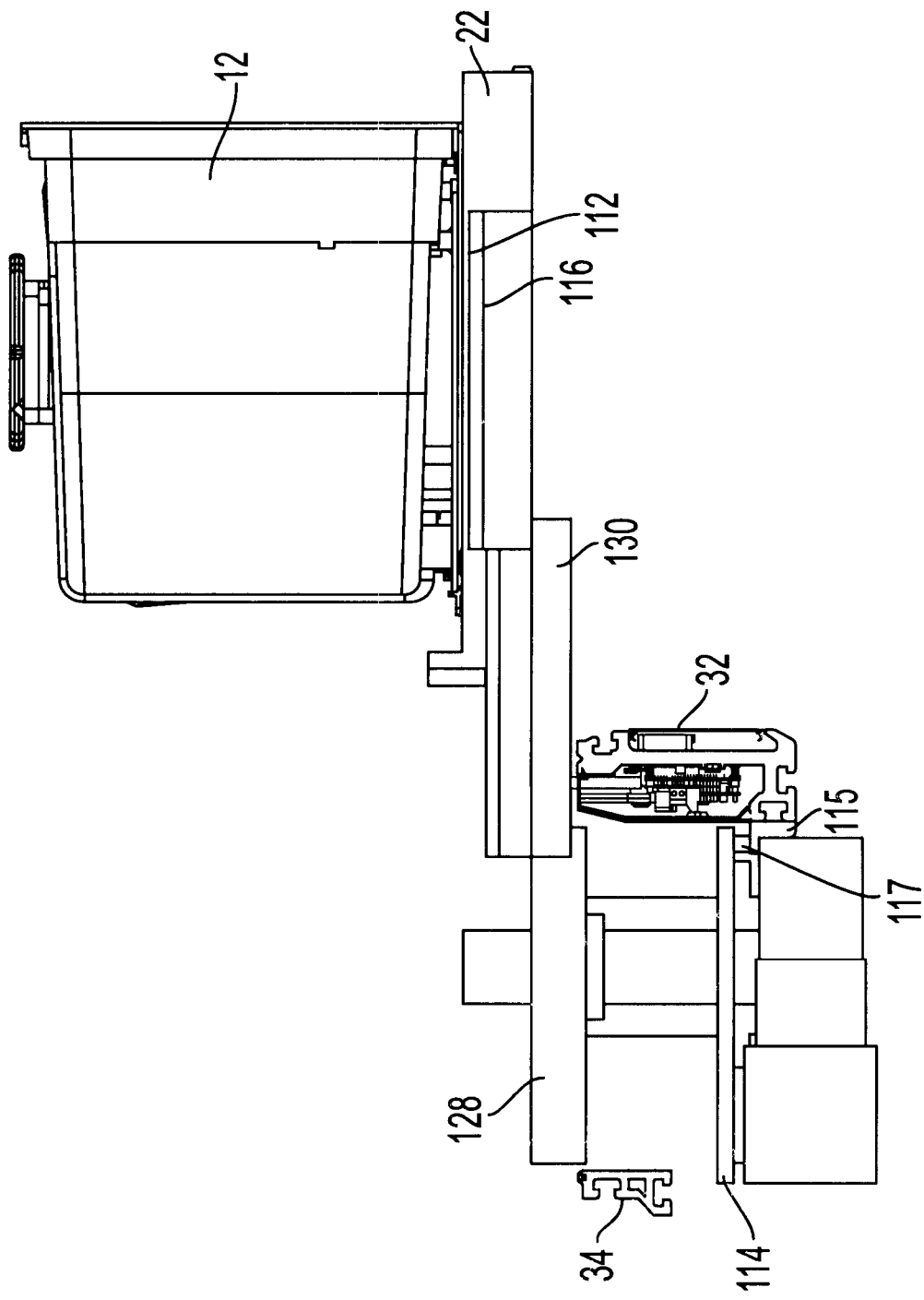
FIG. 12 is a side plan view of the transfer assembly of FIG. 9, shown in the position of FIG. 11.
Figure 13:
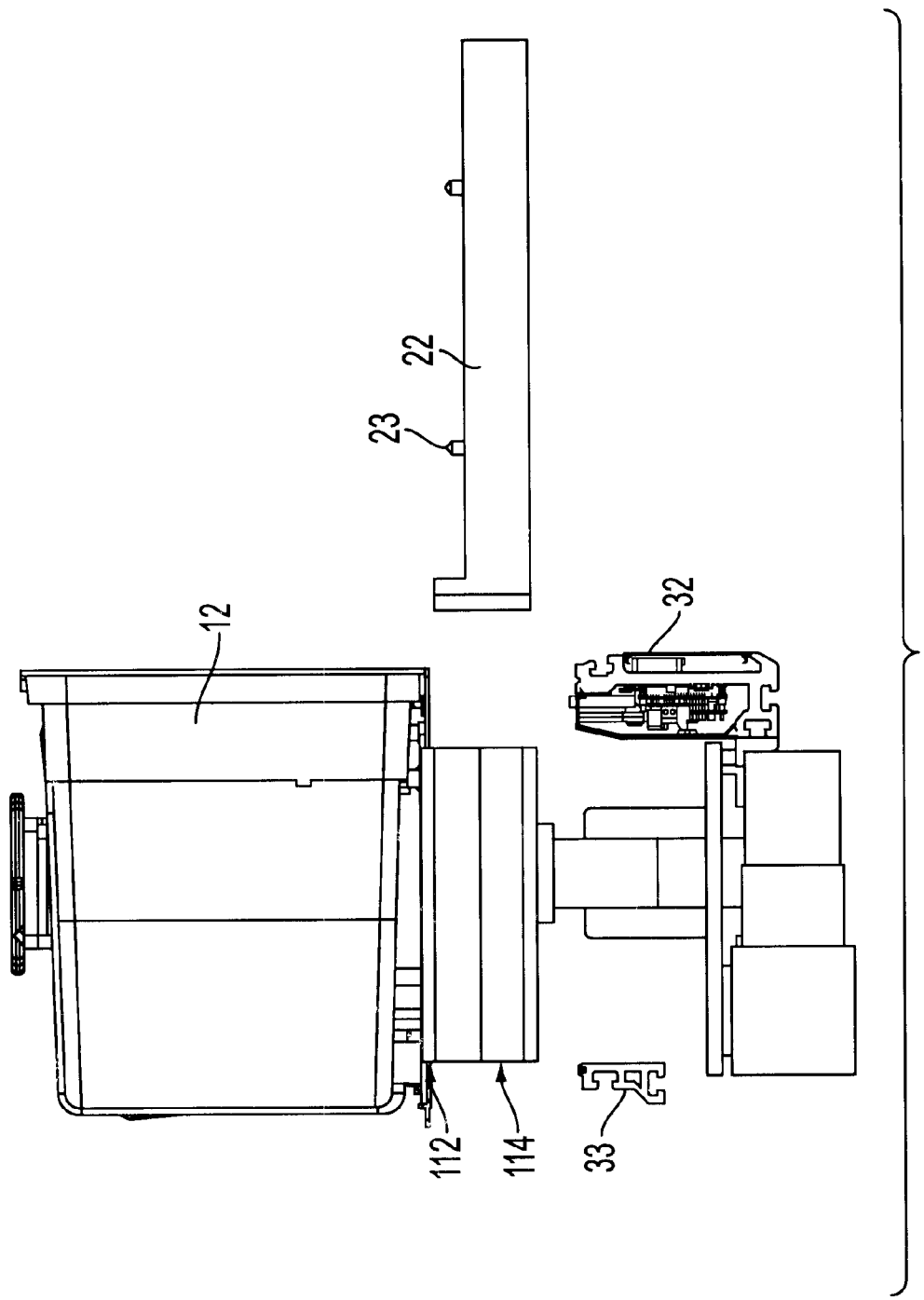
FIG. 13 is a side plan view of the transfer assembly of FIG. 9, shown in the raised position supporting a transport pod.
Figure 14:
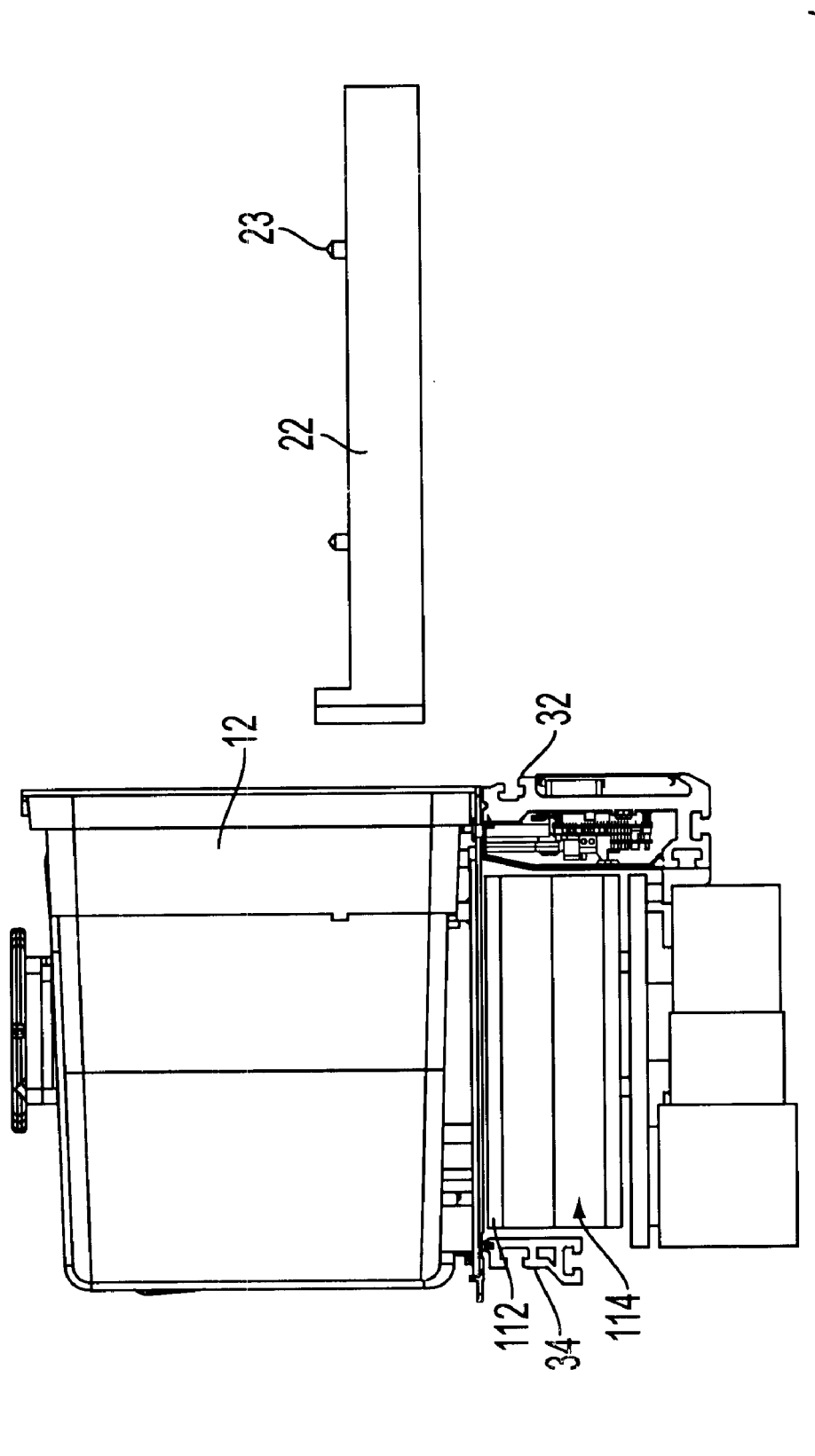
FIG. 14 is side plan view of the transfer assembly of FIG. 9, shown in the retracted position with the transport pod positioned on the conveyor.

To transfer the pod 12 to the load port 22, the support 112 is moved from the retracted position shown in FIG. 14 to the raised position shown in FIG. 13, lifting the transport pod 12 from the conveyor 14. In this position, unlike the raised position shown in FIG. 10, the support 112 is raised to a fully elevated position so that the transport pod 12 is above the elevation of the load port 22. In FIG. 10, the support 112 is raised to a lower elevation such that the support 112 is lower than the level of the transport pod 12 supported on the load port. The displacement assembly 114 extends the raised support 112 and transport pod 12 to position the transport pod 12 above the load port 22. The support 112 is then lowered to position the transport pod 12 on the load port 22 as shown in FIGS. 11 and 12. Once in place, the support 12 is returned to the conveyor 14, shown in FIG. 10, and retracted beneath the level of the drive and idler rails 32, 34 as shown in FIG. 9.

As shown particularly in FIG. 10, the support 112 generally includes a pair of spaced apart support members 116. The support members 116 each include an L-shaped flange 118 shaped to support the outer edges of the transport pod 12. A bead 120 projecting upwardly from the flange 118 seats in an aperture 122 formed in the base plate 124 of the transport pod to stabilize the transport pod 12 against shifting as it is moved between the conveyor 14 and load port 22. Other means may be used to secure the transport pod 12 to the support members 116 instead of or in addition to the beads 120 and L-shaped flanges 118. It is to be understood that the configuration of the support members 116 is subject to considerable variation, and is dependent in part upon the configuration of the base of the transport pod 12.

Figure 15:
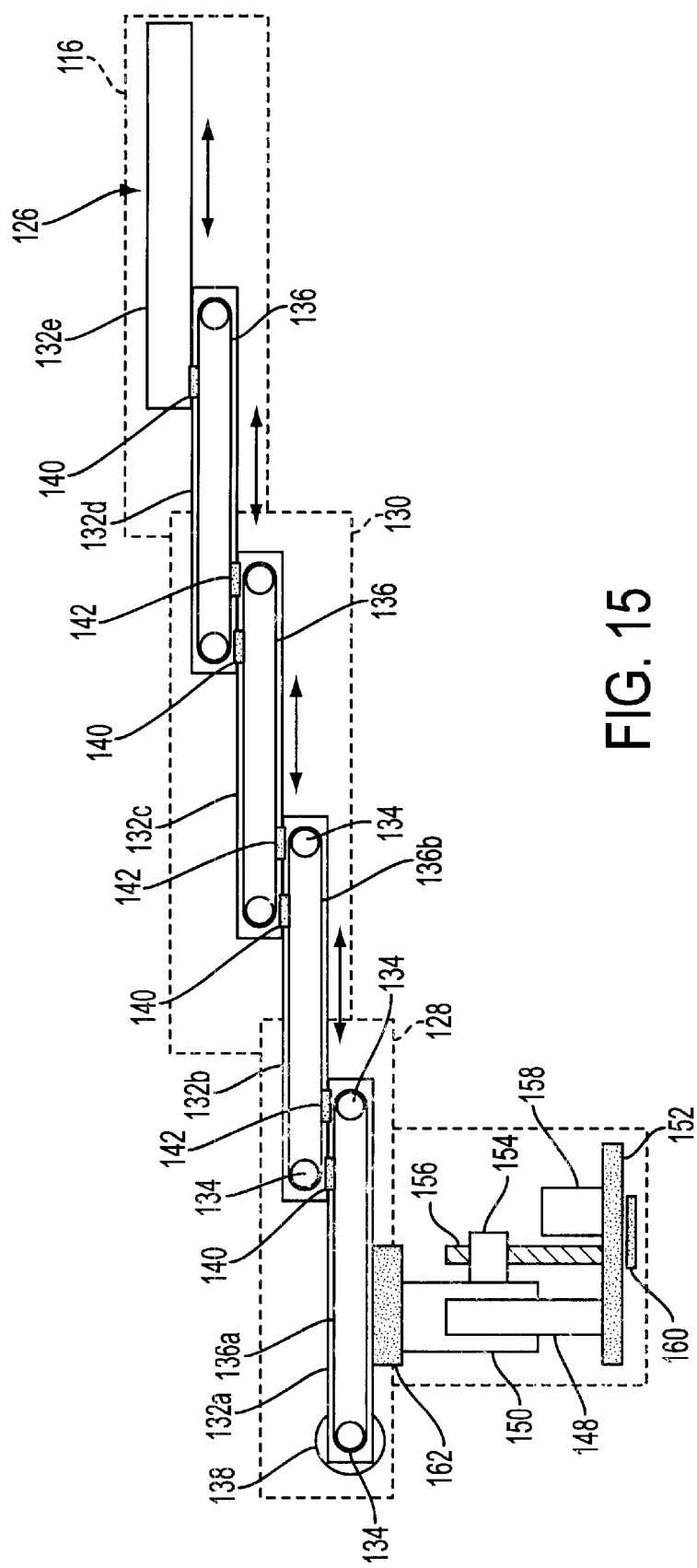
FIG. 15 is a schematic view of the transfer assembly of FIG. 9, shown in the extended position.

The displacement assembly 114 generally include a pair of spaced-apart slide assemblies 126, one of which is shown in FIG. 15, for extending and retracting the support between the load port 22 and conveyor 14. The slide assemblies 126 include a plurality of links 132a–f which disposed in housings 128, 130 and support members 116, shown particularly in FIGS. 11 and 12. The links 132b–e are constrained to slide in the linear direction of the arrows. Each of the links 132a–d includes a pair of pulleys 134 provided at either end of the link 132a–d and a continuous belt 136 extending around the pulleys 134. The belt 136 is preferably formed of a material which is substantially stretch resistant for reliable operation of the slide assembly 126 over repeated operation of the slide assembly 126. A motor 138 is coupled to one of the pulleys 134, preferably the first pulley 134 of link 132a. In the illustrated embodiment the motor 138 is coupled to the first pulley 134 of both slide assemblies 126, although it is to be understood that in other embodiments of the invention separate motors may be employed. The motor 138 is housed within the U-shaped housing 128, shown particularly in FIG. 11.

A first block 140 is mounted to the underside of the link 132b and coupled to the belt 136a carried by the link 132a. A second block 142 extends upwardly from the link 132a and is coupled to the belt 136b carried by the link 132b. Similarly, each of the links 132c–e includes a block 140 extending downwardly from the link 132b–e and coupled to the belt 136 of the link below. Links 132b–d also include a block 142 extending upwardly from the link 132b–d and coupled to the belt 136 of the link above. The blocks 140, 142 couple the links 132a–e together to produce the relative linear movement of the links 132a–e. Directing attention to the first link 132a, the motor 138 drives the first pulley 134 alternately in forward and reverse directions to move the belt 136a around the pulleys 134 in clockwise and counterclockwise directions. This movement of the belt 136a causes the block 140 to move back and forth along the link 132a, with the block 140 carrying the link 132b back and forth relative to the link 132a. As the link 132b is moved back and forth relative to the link 132b, the block 142 causes the belt 136b carried by the link 132b to move around the link 132b. This process is repeated for each of the links 132b–132d. The end link 132e is moved relative to the link 132d by block 140, and does not require pulleys 134 or a belt 136.

The housing 128 is coupled to the link 132a, both of which remain between the drive and idler rails 32, 34. The housing 130 is coupled to the link 132c such that the housing 130 moves back and forth with the link 132c. The link 132e is attached to the support member 116 such that the support member 116 is moved with the link. The housings 128, 130 and support member are shaped so that they nest together when retracted as shown in FIG. 10.

The displacement assembly 114 further includes a lifting assembly 148 for raising and lowering the slide assemblies 126. As shown in FIG. 15, the lift assembly 148 includes a linear slide 150 which is mounted to a support 152 and the link 132a. A threaded nut 154 is mounted to the slide 150 and coupled to a lead screw 156. A motor 158 drives the screw 156 through a belt 160 to extend and retract the slide 150 relative to the support 152, thereby raising and lowering the slide assembly 126. The lift assembly 148 may include one slide 150 which is coupled to a support 162 attached to the links 132a of both slide assemblies 126. Alternatively, the lift assembly 148 may include a pair of slides 150, one attached to each slide assembly 126. When multiple slides 150 are employed, the slides 150 are preferably driven by a common motor 158 to ensure the movement of the slides is precisely synchronized and minimize components of the lift assembly 148. However, it is to be understood that separate motors may also be employed, as well as other suitable components.

The transfer assembly 110 shown in FIGS. 9–15 is particularly suitable for use with a processing machine which includes multiple ports 22. Unlike the previous embodiment, where a separate transfer assembly was required for each load port 22, one transfer assembly 110 may be used for the multiple load ports of a single processing machine. The transfer assembly 110 further includes a slide assembly 168 which moves the support 112 and displacement assembly 144 in a direction parallel to the conveyor 14 to position the support 112 in front of a selected one of the load ports 22. When the support 112 is positioned in front of the selected port, the displacement assembly 114 raises the support 112 to lift a pod from the conveyor and then moves the support 112 and pod 12 toward the work station to transfer the transport pod 12 to the load port 22 as previously described.

The slide assembly 168 may be generally comprised of a standard, commercially available linear actuator. The linear actuator may be belt or lead screw driven. Specifically, the slide assembly 168 may be selected from one of the HLE Series Linear Drives available from Parker Motion & Control. As shown in FIGS. 9–12, the transfer assembly 110 further includes a support rail 115 for supporting an x-axis wheel 117 carried on the bottom surface of plate 119. With reference to FIGS. 10 and 12, the support rail 115 is mounted to the conveyor 14, and supports a wheel 117 which is mounted to the underside of plate 119. Plate 119 is mounted to displacement assembly 114 which slides left to right. This arrangement provides support for the cantilever load on the slide assembly 168 when the transport assembly 110 is in the extended position as shown in FIG. 11. The slide assembly 168 and support rail 115 will vary in length based on the particular application.

The slide assembly 168 provides considerable flexibility when the transport assembly 110 is used with a processing machine which includes several load ports 22. When used with a single port machine, the slide assembly 168 may be eliminated to reduce the cost and size of the transfer assembly 110.

Figure 16:
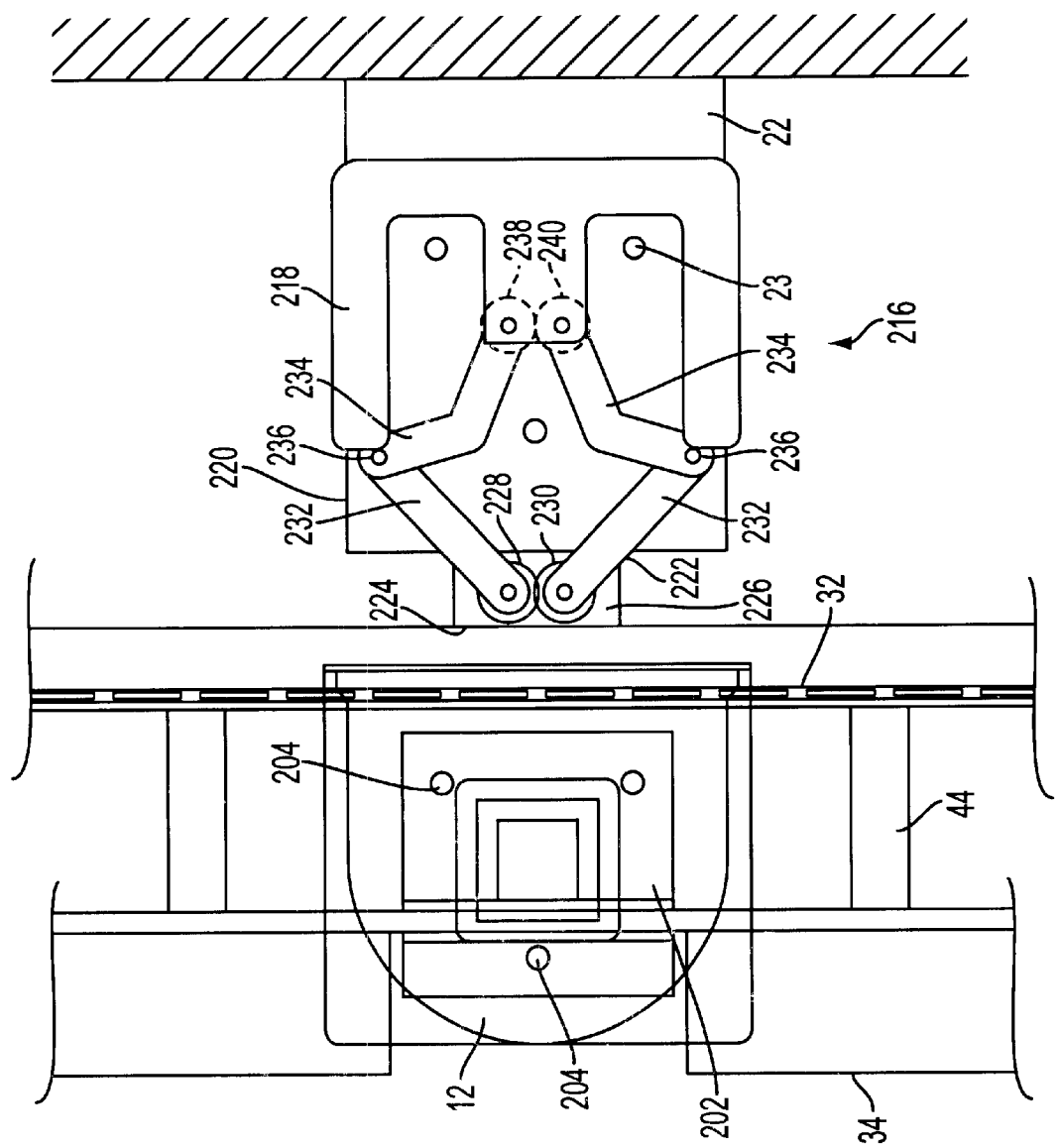
FIG. 16 is a top plan view of a transfer assembly in accordance with another embodiment of the invention, shown in the retracted position.
Figure 17:
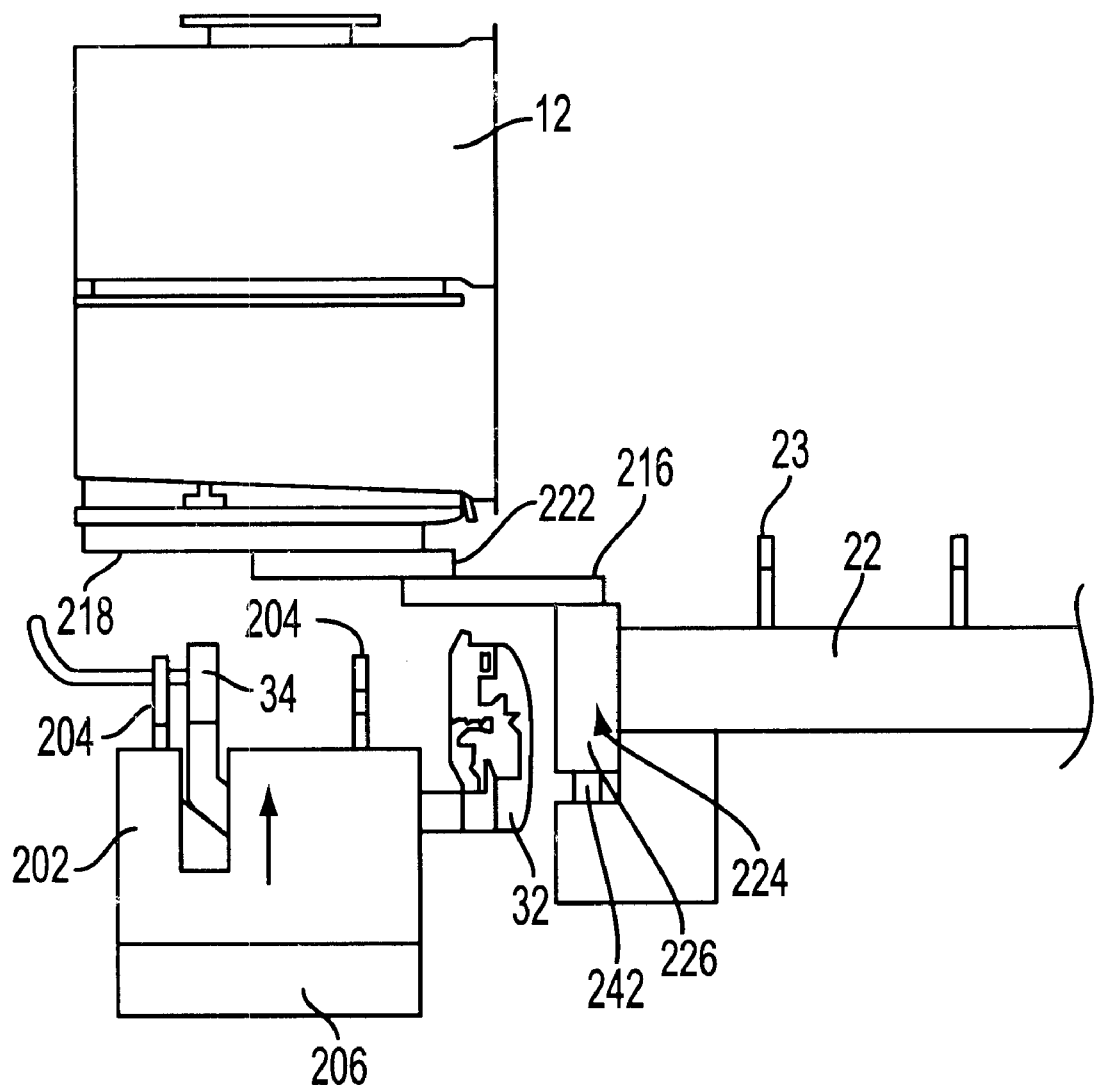
FIG. 17 is a side plan view of the transfer assembly of FIG. 16, shown in an extended position supporting a transport pod.

FIGS. 16 and 17 show yet another embodiment of a transfer assembly 200 in accordance with this invention. The transfer assembly 200 includes a lift mechanism 202 which lifts the transport pod 12 above the conveyor 14. In this embodiment, the lift mechanism 202 includes a plurality of pins 204 which are positioned in the same pattern as the kinematic pins which couple the transport pod 12 to the load port 22. When the lift mechanism 202 is raised by the actuator 206, the pins engage the kinematic slots formed in the underside of the transport pod 12.

An extension assembly 216 is mounted between the conveyor 14 and the load port 22. In the illustrated embodiment, the extension assembly 216 is mounted to the underside of the load port 22, although it is to be understood that the extension member 216 may be mounted to the frame which supports the conveyor 14 or to another frame or support. The extension assembly 216 generally includes a support 218 carried by a pair of robotic arms 220, 222 which moves the support 218 between the retracted position shown in FIG. 16 and the extended position shown in FIG. 17. The arms 220, 222 are moved by a drive assembly 224 which includes a motor (not shown) positioned in a housing 226. The motor is coupled to a gear 228 which is intermeshed with a gear 230 such that rotation of gear 228 produces synchronized and opposite rotation of the gear 230.

Each of the robotic arms 220, 222 includes a first link 232 rigidly attached at one end to one of the gears 228, 230. The other end of the link 232 is pivotally coupled to the proximal end of a second link 234 by a pivot 236. The distal end of the second link 234 of each arm 220, 222 is rigidly attached to a gear 238, 240. The gears 238, 240 are intermeshed for synchronized rotation in opposite directions. As the motor drives the gear 228, the links 232, 234 are pivoted in a controlled, synchronized manner to move the support 218 in a straight line between the extended and retracted positions. Alternatively, other means may be employed to achieve the desired motion, such as but not limited to: belts, bands, and pivoting links.

Once the support 218 is moved from the home position above the load port 22 to a position directly below the raised pod 12, the lift mechanism 202 is actuated to lower the transport pod 12 onto the support 218. Alternatively, the extension assembly 216 may be raised by actuator 242 to lift the transport pod 12 from the pins 204. The arms 220, 222 are then returned to the home above the load port. The extension assembly 216 is then lowered by actuator 242 to deposit the transport pod 12 on the load port 22. The transport pod 12 may be easily returned to the conveyor by raising the extension assembly 216 to lift the pod 12 from the port 22 and driving the extension assembly 216 to move the support 218 to a position above the conveyor 14. The transport pod 12 is deposited on the lift mechanism 202 by raising the lift mechanism 202 and/or lowering the extension assembly 216. After the extension assembly 216 is retracted, the lift mechanism 202 lowers the transport pod 12 onto the conveyor. Alternatively, a conventional Scara/Bifold type robotic arm approach may be employed as the robotic assembly.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the Claims appended hereto and their equivalents.

What is claimed is:

1. A method of transferring a container having a bottom surface between a conveyor having a pair of spaced apart rails and a load port, comprising the steps of:
   (a) engaging the bottom surface of the container while the container is seated on the rails;
   (b) lifting the container off the rails to an end position located above the conveyor along a predetermined path;
   (c) moving the container substantially horizontally from the end position located above the conveyor achieved in said step (b) to a position proximate to the load port; and
   (d) placing the container onto the load port.

2. The method of claim 1, further comprising the steps of:
   (e) removing the container from the load port, and transferring the container to an end position located above the load port;
   (f) moving the container substantially horizontally from the end position located above the load port achieved in said step (e) to the end position located above the conveyor achieved in said step (b); and
   (g) returning the container to the conveyor belt.

3. The method of claim 1, wherein moving the container in said step (c) includes linearly transferring the container by rotatable rollers.

4. The method of claim 1, wherein moving the container in said step (c) includes linearly transferring the container by a sliding mechanism supporting the container.

5. A system for transferring containers having a bottom surface onto a load port, comprising:
   a conveyor having two parallel rails for supporting the container, and for transporting the container between multiple load ports;
   a lifting mechanism including a first device located between said rails of said conveyor, for transferring the container between said conveyor and an end position located above said conveyor, and a second device for transferring the container between the load port and an end position located above the load port; and a displacement mechanism, mechanically attached to said first and second device of said lifting mechanism, for supporting the bottom surface of the container and transferring the container between said first and second device of said lifting mechanism.

6. The system as recited in claim 5, wherein said first and second device of said lifting mechanism are coupled together so that said first and second device operate as a single unit.

7. The system as recited in claim 5, wherein said first and second device of said lifting mechanism are separate components so that said first and second device may be independently operated.

8. The system as recited in claim 5, wherein said displacement mechanism includes a plurality of wheels rotatably mounted to said first and second devices of said lifting mechanism.

9. The system as recited in claim 8, wherein said wheels are driven by a drive unit, said drive unit coupled to said wheels by at least one belt.

10. A system for transferring containers having a bottom surface onto a load port, comprising:

a conveyor having two parallel rails for supporting the container, and for transporting the container between multiple load ports;

a lifting mechanism located between said parallel rails of said conveyor, for vertically transferring the container between said conveyor and an end position located above said conveyor;

an extension mechanism mechanically affixed to said lifting mechanism, for engaging the bottom surface of the container and supporting the container once lifted off said conveyor, and for transferring the container between said end position located above said conveyor and the load port.

11. The system as recited on claim 10, wherein said extension mechanism includes a plurality of interconnected slidable links.

12. A system for transferring containers having a bottom surface onto a load port, comprising:

a conveyor having two parallel rails for supporting the container, and for transporting the container between multiple load ports;

a lifting mechanism having a first device located between said rails of said conveyor, for transferring the container between said conveyor and an end position located above said conveyor, and a second device for transferring the container between the load port and a raised position located above the load port; and a displacement mechanism mechanically attached to said first and second device of said lifting mechanism, for engaging and supporting the bottom surface of the container, and for laterally transferring the container between said first and second device of said lifting mechanism.

13. The system as recited on claim 12, wherein said displacement mechanism includes a plurality of wheels rotatably mounted to said first and second devices of said lifting mechanism.

14. A system for transferring a container having a bottom surface to a load port, comprising:

a conveyor having two parallel rails for supporting the bottom surface of the container, and for transporting the container between multiple load ports;

a support for engaging the bottom surface of the container;

a displacement assembly located between said parallel rails of said conveyor, for vertically lifting the container off said conveyor to an end position located above said conveyor and returning the container to said conveyor;

a slide assembly mechanically affixed to said support and said displacement assembly, having multiple interconnected links for transferring the container between said end position located above said conveyor and an end position located above the load port, and for placing the container onto the load port.

15. A system for transferring containers having a bottom surface between a load port and a conveyor having two parallel rails for supporting the container, comprising:

a lifting mechanism including a first device located between the rails of the conveyor, for transferring the container between the conveyor and an end position located above the conveyor, and a second device for transferring the container between the load port and an end position located above the load port; and a displacement mechanism, mechanically attached to said first and second device of said lifting mechanism, for supporting the bottom surface of the container and transferring the container between said first and second device of said lifting mechanism.

16. A system for transferring containers having a bottom surface between a load port and a conveyor having two parallel rails for supporting the container, comprising:

a lifting mechanism located between the parallel rails of the conveyor, for vertically transferring the container between the conveyor and an end position located above the conveyor;

an extension mechanism mechanically affixed to said lifting mechanism, for engaging the bottom surface of the container and supporting the container once lifted off the conveyor, and for transferring the container between said end position located above the conveyor and the load port.

* * * * *

UNITED STATES PATENT AND TRADEMARK OFFICE
CERTIFICATE OF CORRECTION

PATENT NO. : 6,435,330 B1
DATED : August 20, 2002
INVENTOR(S) : Bonora et al.

It is certified that error appears in the above-identified patent and that said Letters Patent is hereby corrected as shown below:

<u>Title page,</u>
Item [73], Assignee, delete "Asyai Technologies, Inc." and insert
-- Asyst Technologies, Inc. --

Signed and Sealed this

Nineteenth Day of November, 2002

*Attest:*

*Attesting Officer*

JAMES E. ROGAN
*Director of the United States Patent and Trademark Office*